US008379189B2

(12) United States Patent
Nagasaka

(10) Patent No.: US 8,379,189 B2
(45) Date of Patent: Feb. 19, 2013

(54) STAGE DEVICE, EXPOSURE APPARATUS, EXPOSURE METHOD AND DEVICE MANUFACTURING METHOD

(75) Inventor: Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 878 days.

(21) Appl. No.: 12/320,739

(22) Filed: Feb. 3, 2009

(65) Prior Publication Data
US 2009/0208883 A1    Aug. 20, 2009

Related U.S. Application Data

(60) Provisional application No. 61/064,141, filed on Feb. 19, 2008.

(30) Foreign Application Priority Data

Feb. 5, 2008  (JP) ................. 2008-025493

(51) Int. Cl.
G03B 27/58    (2006.01)
G03B 27/52    (2006.01)
G03B 27/42    (2006.01)

(52) U.S. Cl. ................. 355/72; 355/30; 355/53
(58) Field of Classification Search ........... 355/72, 355/53, 30, 77, 73
See application file for complete search history.

(56) References Cited

U.S. PATENT DOCUMENTS

| 4,465,368 A | 8/1984 | Matsuura et al. |
| 5,493,403 A | 2/1996 | Nishi |
| 5,646,413 A | 7/1997 | Nishi |
| 6,208,407 B1 | 3/2001 | Loopstra |
| 6,262,796 B1 | 7/2001 | Loopstra et al. |
| 6,341,007 B1 | 1/2002 | Nishi et al. |
| 6,611,316 B2 | 8/2003 | Sewell |
| 6,778,257 B2 | 8/2004 | Bleeker et al. |
| 6,897,963 B1 | 5/2005 | Taniguchi et al. |
| 7,023,610 B2 | 4/2006 | Ohtsuki et al. |
| 2001/0035168 A1 | 11/2001 | Meyer et al. |
| 2002/0041377 A1 | 4/2002 | Hagiwara et al. |
| 2002/0061469 A1 | 5/2002 | Tanaka |
| 2004/0019128 A1 | 1/2004 | Kondo |
| 2004/0160582 A1 | 8/2004 | Lof et al. |
| 2005/0146694 A1 | 7/2005 | Tokita |
| 2005/0146695 A1 | 7/2005 | Kawakami |
| 2005/0219488 A1 | 10/2005 | Nei et al. |
| 2006/0033892 A1 | 2/2006 | Cadee et al. |

(Continued)

FOREIGN PATENT DOCUMENTS

EP  1 079 223 A1   2/2001
EP  1 713 113 A1   10/2006

(Continued)

OTHER PUBLICATIONS

May 19, 2009 International Search Report issued in Application No. PCT/JP2009/051687.
May 19, 2009 Written Opinion issued in Application No. PCT/JP2009/051687 (with English translation).
Nov. 6, 2012 Office Action issued in JP Application No. 2008-025493 (with English translation).

Primary Examiner — Peter B Kim
(74) Attorney, Agent, or Firm — Oliff & Berridge, PLC

(57) ABSTRACT

A stage apparatus includes a table member which holds a first object; a liquid recovery port which is provided on the table member and via which a first liquid is recovered; a first flow passage which is formed in the table member, which is connected to the liquid recovery port, and through which a second liquid flows to adjust a temperature of the table member; and a pressure-adjusting device which adjusts a pressure of the first flow passage. The stage apparatus is capable of suppressing the temperature change which would be otherwise caused by the heat of vaporization. An exposure apparatus including the stage apparatus is provided.

30 Claims, 9 Drawing Sheets

U.S. PATENT DOCUMENTS

| | | |
|---|---|---|
| 2006/0033898 A1 | 2/2006 | Cadee et al. |
| 2006/0038968 A1 | 2/2006 | Kemper et al. |
| 2006/0087637 A1 | 4/2006 | Ottens et al. |
| 2006/0139614 A1 | 6/2006 | Owa et al. |
| 2006/0285093 A1 | 12/2006 | Hara et al. |
| 2006/0285096 A1 | 12/2006 | Jacobs et al. |
| 2007/0070315 A1 | 3/2007 | Jacobs et al. |
| 2007/0153244 A1 | 7/2007 | Maria Zaal et al. |
| 2007/0273856 A1 | 11/2007 | Margeson |
| 2008/0100812 A1 | 5/2008 | Poon et al. |
| 2008/0106707 A1 | 5/2008 | Kobayashi et al. |
| 2008/0137055 A1 | 6/2008 | Hennus et al. |
| 2008/0158526 A1 | 7/2008 | Hennus et al. |
| 2009/0115977 A1 | 5/2009 | Nagasaka et al. |

FOREIGN PATENT DOCUMENTS

| | | |
|---|---|---|
| EP | 1 713 115 A1 | 10/2006 |
| EP | 1 873 816 A1 | 1/2008 |
| JP | A-2005-252247 | 9/2005 |
| JP | A-2006-54468 | 2/2006 |
| JP | A-2007-194618 | 8/2007 |
| WO | WO 2004/093160 A2 | 10/2004 |
| WO | WO 2004/112108 A1 | 12/2004 |
| WO | WO 2005/024517 A2 | 3/2005 |
| WO | WO 2005/076324 A1 | 8/2005 |
| WO | WO 2006/112436 A1 | 10/2006 |

STAGE DEVICE, EXPOSURE APPARATUS, EXPOSURE METHOD AND DEVICE MANUFACTURING METHOD

CROSS-REFERENCES TO RELATED APPLICATIONS

This application claims the benefit of priority of Japanese Patent Application No. 2008-025493 filed on Feb. 5, 2008 and U.S. Provisional Application Ser. No. 61/064,141 filed on Feb. 19, 2008, the entire disclosures of which are incorporated herein by reference.

BACKGROUND OF THE INVENTION

1. Field of the Invention

The present invention relates to a stage apparatus, an exposure apparatus, an exposure method, and a method for producing a device.

2. Description of the Related Art

In relation to the exposure apparatus to be used in the photolithography step, a liquid immersion exposure apparatus is known, which exposes a substrate with an exposure light (exposure light beam) through or via a liquid as disclosed in United States Patent Application Publication No. 2005/0219488. The liquid immersion exposure apparatus is provided with a stage apparatus or device which holds the substrate at the back surface of the substrate, and exposes the substrate held by the stage apparatus. The liquid, which is supplied to the front surface of the substrate, is recovered from a liquid recovery port opposite to or facing the front surface of the substrate. Reference is also made to other Patent Documents, such as European Patent Application Publication No. 1713115 and United States Patent Application Publication No. 2007/0273856.

SUMMARY OF THE INVENTION

In the liquid immersion exposure apparatus, there is such a possibility that the liquid might enter a space disposed on a side of the back surface (back surface side) of the substrate, and the liquid might be adhered to the back surface of the substrate. If the liquid is left to stand as it is, the following possibility arises. That is, the substrate might be thermally deformed, the stage apparatus might be thermally deformed, and/or the temperatures of the optical paths, for example, for various measuring light (measuring light beams) might be fluctuated or varied due to the heat of vaporization of the liquid. If such an inconvenience arises, the following possibility arises. That is, exposure failure might occur, for example, such that a defect appears in the pattern to be formed on the substrate. As a result, there is such a possibility that a defective device might be produced.

In one aspect, an object of the present invention is to provide a stage apparatus which makes it possible to suppress the influence of the heat of vaporization of the liquid. In another aspect, an object of the present invention is to provide an exposure apparatus and an exposure method which make it possible to suppress the occurrence of the exposure failure. In still another aspect, an object of the present invention is to provide a method for producing a device which makes it possible to suppress the production of defective device.

According to a first aspect of the present invention, there is provided a stage apparatus comprising a table member which holds a first object; a liquid recovery port which is provided on the table member and via which a first liquid is recovered; a first flow passage which is formed in the table member, which is connected to the liquid recovery port, and through which a second liquid flows to adjust a temperature of the table member; and a pressure-adjusting device which adjusts a pressure of the first flow passage.

According to a second aspect of the present invention, there is provided an exposure apparatus which exposes a substrate with an exposure light through a first liquid, the exposure apparatus comprising the stage apparatus as defined in the first aspect.

According to a third aspect of the present invention, there is provided a method for producing a device, comprising exposing a substrate by using the exposure apparatus as defined in the second aspect; developing the exposed substrate; and processing the developed substrate.

According to a fourth aspect of the present invention, there is provided an exposure apparatus which exposes a substrate through a first liquid, the exposure apparatus comprising an optical member via which an exposure light exits; a table which holds an object or the substrate; a recovery port which is provided on the table and via which the first liquid is recovered; and a flow passage which is formed in the table and through which a second liquid flows to adjust a temperature of the table; wherein the recovery port and the flow passage are in fluid-communication in the table.

According to a fifth aspect of the present invention, there is provided an exposure method for exposing a substrate with an exposure light through a first liquid, the exposure method comprising holding the substrate on a table member; adjusting a temperature of the table member by causing a second liquid to flow through a first flow passage provided in the table member and connected to a liquid recovery port which is provided on the table member and via which at least a part of the first liquid is recovered; filling an optical path for the exposure light with the first liquid, the optical path being between an optical member and the substrate; and adjusting a pressure of the first flow passage.

According to a sixth aspect of the present invention, there is provided a method for producing a device, comprising exposing a substrate by using the exposure method as defined in the fourth aspect; developing the exposed substrate; and processing the developed substrate.

According to the aspects of the present invention, it is possible to suppress the influence of the heat of vaporization. According to the aspects of the present invention, it is possible to suppress the occurrence of the exposure failure. According to the aspects of the present invention, it is possible to suppress the occurrence or appearance of the defective device.

DESCRIPTION OF THE PREFERRED EMBODIMENTS

Embodiments of the present invention will be explained below with reference to the drawings. However, the present invention is not limited to these embodiments. In the following description, a XYZ rectangular coordinates system is defined. The positional relationship concerning the respective members will be explained with reference to the XYZ rectangular coordinates system. The X axis direction is a predetermined direction in a horizontal plane, the Y axis direction is a direction which is perpendicular to the X axis direction in the horizontal plane, and the Z axis direction is a direction which is perpendicular to each of the X axis direction and the Y axis direction (i.e., the vertical direction). The directions of rotation (inclination) about the X axis, the Y axis, and the Z axis are designated as the θX, θY, and θZ directions respectively.

First Embodiment

Figure 1:
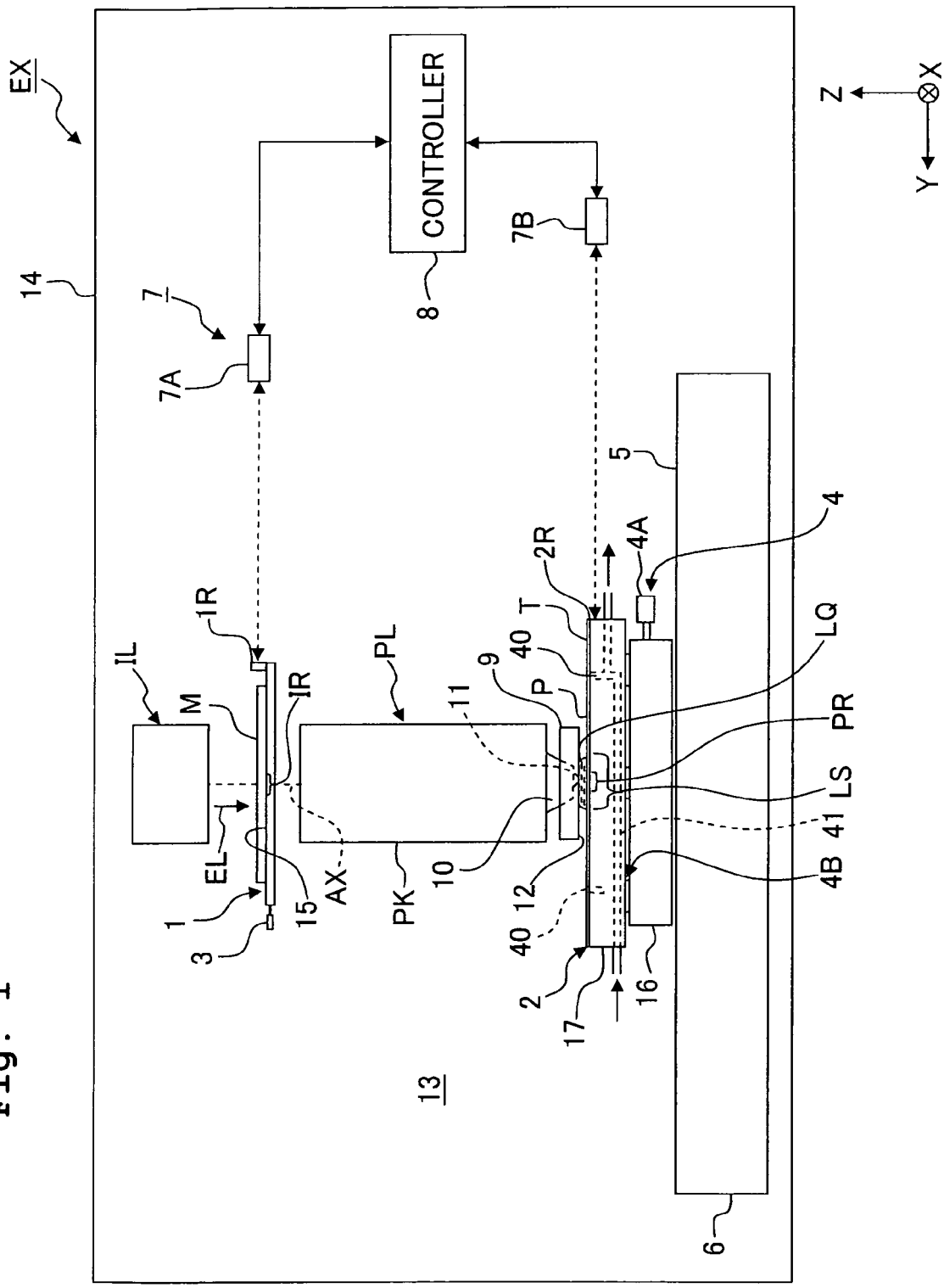
FIG. 1 is a schematic construction of an example of an exposure apparatus according to a first embodiment.

A first embodiment will be explained. FIG. 1 shows a schematic construction of an exposure apparatus EX according to the first embodiment. With reference to FIG. 1, the exposure apparatus EX includes a mask stage 1 which is movable while holding a mask M; a substrate stage 2 which has a substrate table 17 for holding a substrate P and which is movable while holding the substrate P with the substrate table 17; a first driving system 3 which moves the mask stage 1; a second driving system 4 which moves the substrate stage 2; an interferometer system 7 which measures position information about each of the stages 1, 2; an illumination system IL which illuminates the mask M with an exposure light EL; a projection optical system PL which projects, onto the substrate P, an image of a pattern of the mask M illuminated with the exposure light EL; and a controller 8 which controls the overall operation of the exposure apparatus EX.

The exposure apparatus EX further includes a chamber device 14 which defines an internal space 13 in which the substrate P is processed. The chamber device 14 is capable of adjusting or regulating the environment (including the temperature, the humidity, the cleanness, and the pressure) of the internal space 13. In this embodiment, the chamber device 14 adjusts the pressure of the internal space 13 to be approximately the atmospheric pressure. The chamber device 14 may be previously provided at a place at which the exposure apparatus is to be installed. Therefore, it is also allowable that the exposure apparatus is not provided with the chamber device 14.

The mask M includes a reticle on which a device pattern to be projected onto the substrate P is formed. The mask M includes a transmission type mask having a predetermined pattern formed by using, for example, a light-shielding film such as chromium on a transparent plate such as a glass plate. A reflection type mask can be also used as the mask M. The substrate P is a substrate for producing a device, and includes a photosensitive film. The photosensitive film is a film of a photosensitive material (photoresist).

The exposure apparatus EX of this embodiment is a liquid immersion exposure apparatus in which the substrate P is exposed with the exposure light EL through or via a first liquid LQ. The exposure apparatus EX is provided with a liquid immersion member 9 which is capable of forming a liquid immersion space LS so that at least a part of the optical path for the exposure light EL is filled with the first liquid LQ. The liquid immersion space LS is a space filled with the liquid. In this embodiment, water (pure or purified water) is used as the first liquid LQ.

In this embodiment, the liquid immersion space LS is formed so that the first liquid LQ fills the optical path for the exposure light EL exiting from a final (last) optical element 10 which is closest to the image plane of the projection optical system PL among a plurality of optical elements of the projection optical system PL. The final optical element 10 has a light-exit surface 11 from which the exposure light EL exits toward the image plane of the projection optical system PL. The liquid immersion space LS is formed so that the optical path for the exposure light EL, which is disposed between the final optical element 10 and an object arranged at a position at which the object is opposite to or faces the light-exit surface 11 of the final optical element 10, is filled with the first liquid LQ. The position, opposite to or facing the light-exit surface 11, includes the position of irradiation of the exposure light EL exiting from the light-exit surface 11.

The liquid immersion member 9 is arranged in the vicinity of the final optical element 10. The liquid immersion member 9 has a lower surface 12. In this embodiment, the object, which can be opposite to the light-exit surface 11, can be opposite to the lower surface 12. When the surface of the object is arranged at the position opposite to the light-exit surface 11, at least a part of the lower surface 12 is opposite to the surface of the object. When the light-exit surface 11 is opposite to the surface of the object, the first liquid LQ can be held or retained between the light-exit surface 11 of the final optical element 10 and the surface of the object. When the lower surface 12 is opposite to the surface of the object, the first liquid LQ can be retained between the lower surface 12 of the liquid immersion member 9 and the surface of the object. The liquid immersion space LS is formed by the first liquid LQ retained between the light-exit surface 11 and the lower surface 12 which are disposed on one side and the surface of the object which is disposed on the other side.

In this embodiment, the object, which can be opposite to (is opposable to) the light-exit surface 11 and the lower surface 12, includes an object which is movable in a predetermined plane including the position of irradiation of the exposure light EL. In this embodiment, the object includes at least one of the substrate stage 2 and the substrate P held by the substrate stage 2. In this embodiment, the substrate stage 2 is movable on a guide surface 5 of a base member 6. In this embodiment, the guide surface 5 is substantially parallel to the XY plane. The substrate stage 2 is movable in the XY plane including the position of irradiation of the exposure light EL, on the guide surface 5 while holding the substrate P.

In this embodiment, the liquid immersion space LS is formed so that part of the area (partial area, local area) of the surface of the substrate P arranged at the position opposite to the light-exit surface 11 and the lower surface 12 is covered with the first liquid LQ. The interface (meniscus, edge) of the first liquid LQ is formed between the surface of the substrate P and the lower surface 12. That is, in this embodiment, the exposure apparatus EX adopts the local liquid immersion system in which the liquid immersion space LS is formed so that the partial area on the substrate P including a projection area PR of the projection optical system PL is covered with the first liquid LQ during the exposure of the substrate P. In other words, the entire surface of the substrate P or the substrate stage (substrate table) is not immersed in the liquid during the exposure of the substrate P, but only a part of the substrate P is covered with the liquid.

In this embodiment, the substrate table 17 is provided with a second recovery port 40 for recovering the first liquid LQ (via which the first liquid LQ is recovered). In this embodiment, an internal flow passage 41, through which a second liquid LT is allowed to flow in order to adjust the temperature of the substrate table 17, is formed in the substrate table 17. A part of the internal flow passage 41 is connected to the second recovery port 40.

The illumination system IL illuminates a predetermined illumination area IR with the exposure light EL having a uniform illuminance distribution. The illumination system IL illuminates at least a part of the mask M arranged in the illumination area IR with the exposure light EL having the uniform illuminance distribution. Lights usable as the exposure light EL irradiated from the illumination system IL include, for example, the far ultraviolet light beams (DUV light beams) such as the emission lines (g-ray, h-ray, and i-ray) radiated, for example, from a mercury lamp and the KrF excimer laser beam (wavelength: 248 nm), and the vacuum ultraviolet light beams (VUV light beams) such as the ArF excimer laser beam (wavelength: 193 nm), the $F_2$ laser beam (wavelength: 157 nm), and the like. In this embodiment, the ArF excimer laser beam, which is the ultraviolet light beam (vacuum ultraviolet light beam), is used as the exposure light EL.

The mask stage 1 has a mask-holding portion 15 which releasably holds the mask M. In this embodiment, the mask-holding portion 15 holds the mask M so that a pattern formation surface (lower surface) of the mask M is substantially parallel to the XY plane. The first driving system 3 includes an actuator such as a linear motor. The mask stage 1 is movable in the XY plane while holding the mask M in accordance with the operation of the first driving system 3. In this embodiment, the mask stage 1 is movable in the three directions, i.e., in the X axis, Y axis, and θZ directions in a state that the mask-holding portion 15 holds the mask M.

The projection optical system PL radiates (irradiates) the exposure light EL onto the predetermined projection area PR. The projection optical system PL projects the image of the pattern of the mask M at a predetermined projection magnification onto at least a part of the substrate P arranged in the projection area PR. The plurality of optical elements of the projection optical system PL are held by a barrel PK. The projection optical system PL of this embodiment is of the reduction system having the projection magnification which is, for example, ¼, ⅕, ⅛ or the like. The projection optical system PL may be of any one of the 1× magnification system and the magnifying system. In this embodiment, the optical axis AX of the projection optical system PL is substantially parallel to the Z axis. The projection optical system PL may be of any one of the dioptric system including no catoptric optical element, the catoptric system including no dioptric optical element, and the catadioptric system including catoptric and dioptric optical elements. The projection optical system PL may form any one of inverted image and erecting image.

The substrate stage 2 has a body 16 of the substrate stage (stage body), and the substrate table 17 which is provided on the stage body 16 and which is capable of holding the substrate P. The stage body 16 is supported in a non-contact manner on the guide surface 5 by a gas bearing. The stage body 16 is movable in the XY directions on the guide surface 5. The substrate stage 2 is movable in a predetermined area, of the guide surface 5, including the positions opposite to or facing the light-exit surface 11 and the lower surface 12 on the light-exit side of the final optical element 10 (on the image plane side of the projection optical system PL) in a state that the substrate table 2 holds the substrate P.

The second driving system 4 has a coarse movement system 4A which includes, for example, an actuator such as a linear motor and which is capable of moving the stage body 16 in the X axis, Y axis, and θZ directions on the guide surface 5; and a fine movement system 4B which includes, for example, an actuator such as a voice coil motor and which is capable of moving the substrate table 17 in the Z axis, θX, and θY directions with respect to the stage body 16. The substrate table 17 is movable in the six directions, i.e., the X axis, Y axis, Z axis, θX, θY, and θZ directions in a state that the substrate table 2 holds the substrate P, in accordance with the operation of the second driving system 4 including the coarse movement system 4A and the fine movement system 4B.

The interferometer system 7 measures the position information about each of the mask stage 1 and the substrate stage 2 in the XY plane. The interferometer system 7 is provided with a laser interferometer 7A which measures the position information about the mask stage 1 in the XY plane, and a laser interferometer 7B which measures the position information about the substrate stage 2 in the XY plane. The laser interferometer 7A irradiates a measuring light (measuring light beam) onto a reflecting surface IR arranged on the mask stage 1 to measure the position information about the mask stage 1 (mask M) in relation to the X axis, Y axis, and θZ directions by using the measuring light via the reflecting surface 1R. The laser interferometer 7B irradiates a measuring light onto a reflecting surface 2R arranged on the substrate stage 2 (substrate table 17) to measure the position information about the substrate stage 2 (substrate P) in relation to the X axis, Y axis, and θZ directions by using the measuring light via the reflecting surface 2R.

In this embodiment, a focus/leveling-detecting system (not shown) is arranged, which detects the position information about the surface of the substrate P held by the substrate stage 2. The focus/leveling-detecting system detects the position information about the substrate P in relation to the Z axis, θX axis, and θY directions.

During the exposure of the substrate P, the position information about the mask stage 1 is measured by the laser interferometer 7A, and the position information about the substrate stage 2 is measured by the laser interferometer 7B. The controller 8 operates the first driving system 3 based on the measurement result of the laser interferometer 7A to execute the position control of the mask M held by the mask stage 1. The controller 8 operates the second driving system 4 based on the measurement result of the laser interferometer 7B and the detection result of the focus/leveling-detecting system to execute the position control of the substrate P held by the substrate stage 2.

The exposure apparatus EX of this embodiment is a scanning type exposure apparatus (so-called the scanning stepper) in which an image of the pattern of the mask M is projected onto the substrate P while synchronously moving the mask M and the substrate P in a predetermined scanning direction. During the exposure of the substrate P, the controller 8 controls the mask stage 1 and the substrate stage 2 to move the mask M and the substrate P in the predetermined scanning direction in the XY plane which intersects the optical path for the exposure light EL (optical axis AX). In this embodiment, the scanning direction of the substrate P (synchronous movement direction) is the Y axis direction, and the scanning direction of the mask M (synchronous movement direction) is also the Y axis direction. The controller 8 moves the substrate P in the Y axis direction with respect to the projection area PR of the projection optical system PL, and the controller 8 irradiates the exposure light EL onto the substrate P via the projection optical system PL and the first liquid LQ of the liquid immersion space LS on the substrate P, while moving the mask M in the Y axis direction with respect to the illumination area IR of the illumination system IL in synchronization with the movement of the substrate P in the Y axis direction. Accordingly, the substrate P is exposed with the exposure light EL, and the image of the pattern of the mask M is projected onto the substrate P.

Figure 2:
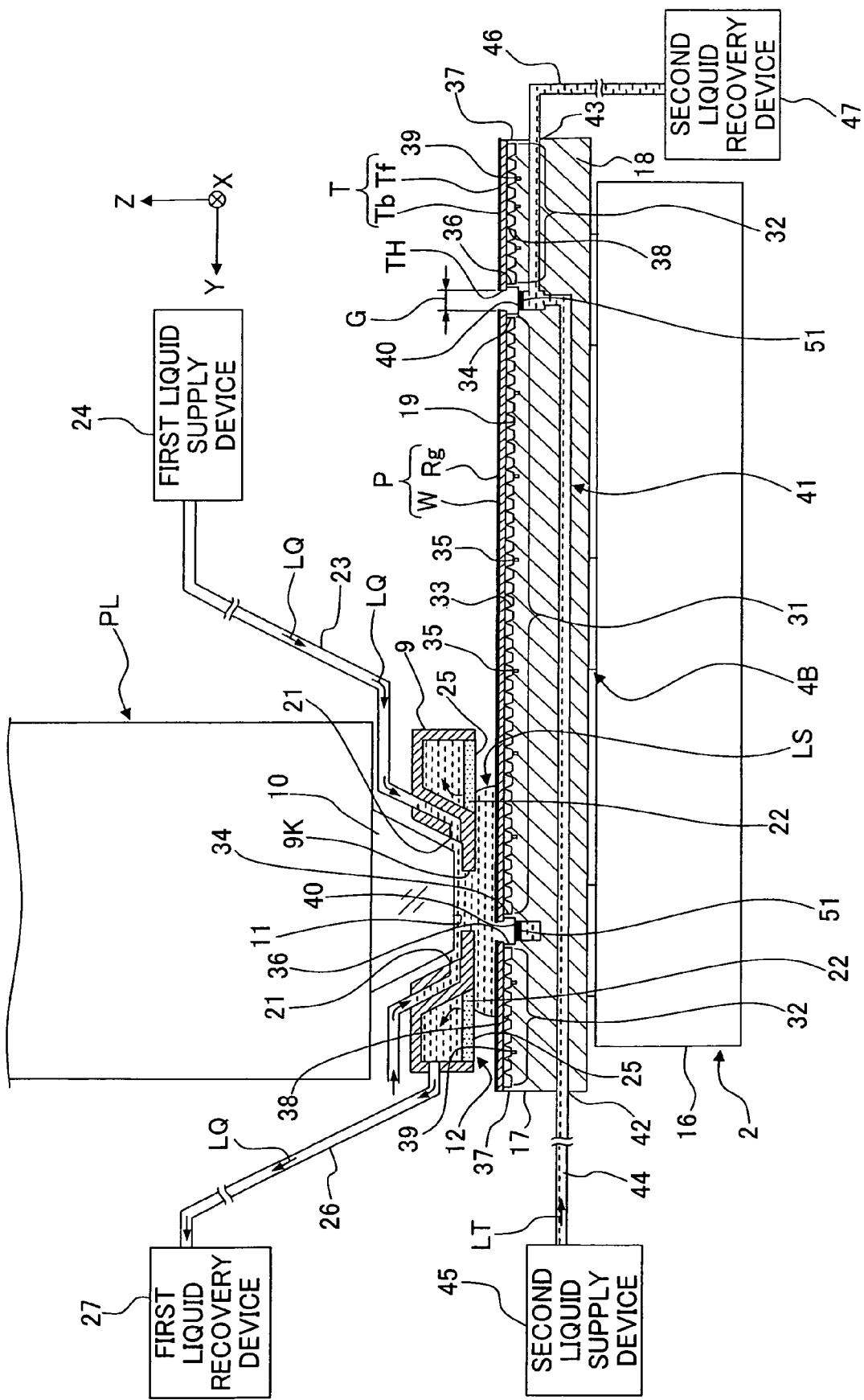
FIG. 2 is a side sectional view of those disposed in the vicinity of a liquid immersion member and a substrate table according to the first embodiment.

Next, the liquid immersion member 9 and the substrate stage 2 will be explained with reference to FIGS. 1 and 2. FIG. 2 shows a side sectional view of those disposed in the vicinity of the liquid immersion member 9 and the substrate stage 2.

The liquid immersion member 9 is an annular member. The liquid immersion member 9 is arranged around the final optical element 10. As shown in FIG. 2, the liquid immersion member 9 has an opening 9K, through which the exposure light EL is allowed to pass, at a position opposite to or facing the light-exit surface 11. The liquid immersion member 9 is provided with a first supply port 21 which is capable of supplying the first liquid LQ, and a first recovery port 22 which is capable of recovering the first liquid LQ.

The first supply port 21 is capable of supplying the first liquid LQ in order to form the liquid immersion space LS. The first supply port 21 is arranged on the liquid immersion member 9 at a predetermined position of the liquid immersion member 9, in the vicinity of the optical path of the exposure light EL, so that the first supply port 21 faces or is oriented to the optical path for the exposure light EL. The first supply port 21 is connected to a first liquid supply device 24 via a flow passage 23. The first liquid supply device 24 has a temperature-adjusting device which is provided at the inside thereof, and the first liquid supply device 24 is capable of feeding the first liquid LQ which is clean and temperature-adjusted. The temperature of the first liquid LQ affects the refractive index of the liquid LQ in the liquid immersion space LS, and hence the temperature of the first liquid LQ is set to a predetermined temperature. The flow passage 23 includes a supply flow passage which is formed in the liquid immersion member 9, and a flow passage which is formed by a supply tube connecting the supply flow passage and the first liquid supply device 24. The first liquid LQ, which is fed from the first liquid supply device 24, is supplied via the flow passage 23 to the first supply port 21.

The first recovery port 22 is capable of recovering, from above the object, at least a part of the first liquid LQ on the object opposite to or facing the lower surface 12 of the liquid immersion member 9. In this embodiment, the first recovery port 22 is arranged around the opening 9K. The first recovery port 22 is arranged in the liquid immersion member 9 at the predetermined position of the liquid immersion member 9 to be opposable to the surface of the object. A plate-shaped porous member 25, which includes a plurality of openings or pores, is arranged in the first recovery port 22. The porous member 25 includes a mesh filter having a large number of small openings or pores formed in a mesh form. In this embodiment, the lower surface 12 of the liquid immersion member 9 includes the lower surface of the porous member 25. The first recovery port 22 is connected to a first liquid recovery device 27 via a flow passage 26. The first liquid recovery device 27 includes a vacuum system, and is capable of sucking and recovering the first liquid LQ. The flow passage 26 includes a recovery flow passage which is formed in the liquid immersion member 9, and a flow passage which is formed by a recovery tube connecting the recovery flow passage and the first liquid recovery device 27. The first liquid LQ, which is recovered from the first recovery port 22, is recovered by the first liquid recovery device 27 via the flow passage 26. As described later on, a part of the first liquid LQ is recovered by a second liquid recovery device 47 in some cases.

In this embodiment, the controller 8 executes the liquid recovery operation performed by the first liquid recovery device 27 concurrently with the liquid supply operation performed by the first liquid supply device 24, thereby making it possible to form the liquid immersion space LS with the first liquid LQ between the final optical element 10 and the liquid immersion member 9 and the object opposite to or facing the final optical element 10 and the liquid immersion member 9. During the exposure of the substrate P, the first liquid LQ is held or retained between the liquid immersion member 9 and the substrate P so that the optical path for the exposure light EL, irradiated from the light-exit surface 11 of the final optical element 10, is filled with the first liquid LQ. Any apparatus or device, which can be utilized at the place at which the exposure apparatus is installed, can be used as the first liquid supply device 24, the first liquid recovery device 27, and parts and the power source in relation thereto. Therefore, it is also allowable that the exposure apparatus itself is not provided with the first liquid supply device 24, the first liquid recovery device 27, and the parts and the power source in relation thereto.

The substrate table 17 is provided with a first holding portion 31 which holds the substrate P. In this embodiment, the substrate table 17 has a second holding portion 32 which is provided around the first holding portion 31. The first holding portion 31 is opposite to the back surface (lower surface) of the substrate P, and the first holding portion 31 holds or retains the back surface of the substrate P. The second holding portion 32 is opposite to a back surface (lower surface) of a plate member T, and the second holding portion 32 holds or retains the back surface of the plate member T.

The substrate table 17 has a base member 18. The first holding portion 31 and the second holding portion 32 are provided on the upper surface 19 of the base member 18 opposable to the back surface of the substrate P and the back surface of the plate member T, respectively.

The plate member T has an opening TH in which the substrate P can be arranged. The plate member T, which is held by the second holding portion 32, is arranged around the substrate P held by the first holding portion 31.

In this embodiment, the surface or front surface of the substrate P is liquid-repellent with respect to the first liquid LQ. As shown in FIG. 2, in this embodiment, the substrate P includes a base member W which includes, for example, a semiconductor wafer such as a silicon wafer, and a photosensitive film Rg which is formed on the base member W. In this embodiment, the surface of the substrate P includes a surface of the photosensitive film Rg. In this embodiment, the photosensitive film Rg is liquid-repellent with respect to the first liquid LQ. The contact angle of the surface of the substrate P with respect to the first liquid LQ is, for example, not less than 90 degrees. The surface of the substrate P may be formed of a protective film which covers the photosensitive film Rg. The protective film is a film referred to also as "top coat film", and protects the photosensitive film Rg from the liquid LQ.

In this embodiment, the surface or front surface of the plate member T is liquid-repellent with respect to the first liquid LQ. As shown in FIG. 2, in this embodiment, the plate member T includes a base member Tb which is made of metal such as stainless steel, and a film Tf which is made of a liquid-repellent material formed on the base member Tb. In this embodiment, the surface of the plate member T includes a surface of the film Tf made of the liquid-repellent material. Those usable as the liquid-repellent material include PFA (Tetrafluoro ethylene-perfluoro alkylvinyl ether copolymer), PTFE (Poly tetra fluoro ethylene), PEEK (polyetheretherketone), Teflon (trade name), etc. The plate member T itself may be formed of the liquid-repellent-material. In this embodiment, the contact angle of the surface of the plate member T with respect to the liquid LQ is, for example, not less than 90 degrees.

In this embodiment, the first holding portion 31 includes a so-call pin chuck mechanism and releasably holds the substrate P. In this embodiment, the first holding portion 31 includes a plurality of first support portions 33 which are arranged on the upper surface 19 of the base member 18 and which support the back surface of the substrate P, a first rim portion 34 which is arranged on the upper surface 19 around the first support portions 33 and which has an annular upper surface opposite to or facing the back surface of the substrate P, and a first sucking port 35 which is arranged on the upper surface 19 at a portion located inside the first rim portion 34 and which sucks a gas. Each of the plurality of first support portions 33 has a pin-shaped form (projection or protrusion form). The first rim portion 34 is formed to have an annular shape approximately same as the outer shape of the substrate P. The upper surface of the first rim portion 34 is opposite to or faces the circumferential edge area (edge area) of the back surface of the substrate P. A plurality of pieces of first sucking port 35 are provided on the upper surface 19 at the portion located inside of the first rim portion 34. Each of the first sucking ports 35 is connected to a suction device (not shown) including a vacuum system, etc. The controller 8 evacuates the gas from a first space surrounded by the back surface of the substrate P, the first rim portion 34, and the base member 18 via the first sucking ports 35 with the suction device, so as to negatively pressurize the first space, thereby holding the substrate P with the first support portions 33 by suction-attraction. By stopping the sucking operation which is performed by the suction device connected to the first sucking ports 35, the substrate P can be released from the first holding portion 31.

The second holding portion 32 also includes a so-called pin chuck mechanism and releasably holds the plate member T. In this embodiment, the second holding portion 32 includes a second rim portion 36 which is arranged on the upper surface 19 around the first rim portion 34 and which has an annular upper surface opposite to or facing the back surface of the plate member T, a third rim portion 37 which is arranged on the upper surface 19 around the second rim portion 36 and which has an annular upper surface opposite to or facing the back surface of the plate member T, a plurality of second support portions 38 which are arranged on the upper surface 19 between the second rim portion 36 and the third rim portion 37 and which support the back surface of the plate member T, and a second sucking port 39 which is arranged on the upper surface 19 between the second rim portion 36 and the third rim portion 37 and which sucks the gas. Each of the plurality of second support portions 38 has a pin-shaped form (projection form). The upper surface of the second rim portion 36 is opposite to or faces the inner edge area (edge area disposed on the inner side) of the back surface of the plate member T in the vicinity of the opening TH. The upper surface of the third rim portion 37 is opposite to the outer edge area (edge area disposed on the outer side) of the back surface of the plate member T. A plurality of pieces of the second sucking port 39 are provided on the upper surface 19 between the second rim portion 36 and the third rim portion 37. Each of the second sucking ports 39 is connected to a suction device (not shown) including a vacuum system. The controller 8 evacuates the gas from the second space surrounded by the back surface of the plate member T, the second rim portion 36, the third rim portion 37, and the base member 18 via the second sucking ports 39 with the suction device, so as to negatively pressurize the second space, thereby holding the plate member T with the second support portions 38 by suction-attraction. By stopping the sucking operation which is performed by the suction device connected to the second sucking ports 39, the plate member T can be released from the second holding portion 32.

In this embodiment, the first holding portion 31 holds the substrate P so that the surface of the substrate P is substantially parallel to the XY plane. The second holding portion 32 holds the plate member T so that the surface of the plate member T is substantially parallel to the XY plane. In this embodiment, the surface of the substrate P held by the first holding portion 31 and the surface of the plate member T held by the second holding portion 32 are arranged in a substantially same plane (substantially flushed with each other). The surface of the substrate P and the surface of the plate member T can be opposite to the light-exit surface 11 and the lower surface 12. In this embodiment, the surface of the plate member T includes the upper surface of the substrate stage 2 (substrate table 17) opposable to the light-exit surface 11 and the lower surface 12.

In this embodiment, a predetermined gap G is formed between the surface (edge) of the substrate P held by the first holding portion 31 and the surface (inner edge) of the plate member T held by the second holding portion 32. In this embodiment, as shown in FIG. 2, the liquid immersion space LS, which is formed by the first liquid LQ supplied from the first supply port 21, is formed while ranging over the surface of the substrate P and the surface of the plate member T in some cases. That is, in this embodiment, the liquid immersion space LS is formed on the gap G in some cases. In this embodiment, the size of the gap G is determined so that the first liquid LQ, which is supplied from the first supply port 21, does not flow into (inflow into) the gap G due to the surface tension of the first liquid LQ. The size of the gap G is, for example, not more than 1 mm. Each of the surface of the substrate P on one side forming the gap G and the surface of the plate member T on the other side forming the gap G is liquid-repellent with respect to the first liquid LQ. By optimizing the size of the gap G, the inflow of the first liquid LQ from the gap G is thus suppressed.

Note that in some cases, the circumferential edge area of the surface of the substrate P is not liquid-repellent. In such a situation, the inflow of the first liquid LQ from the gap G is not suppressed in some cases.

Figure 3:
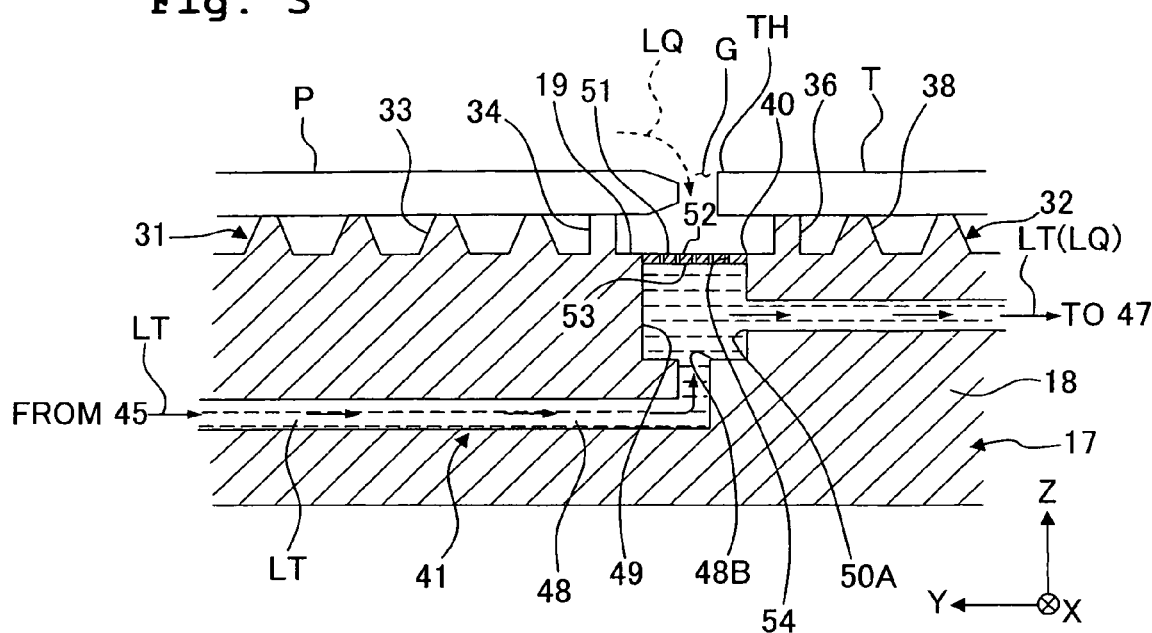
FIG. 3 is a side sectional view of those disposed in the vicinity of a second recovery port according to the first embodiment.
Figure 4:
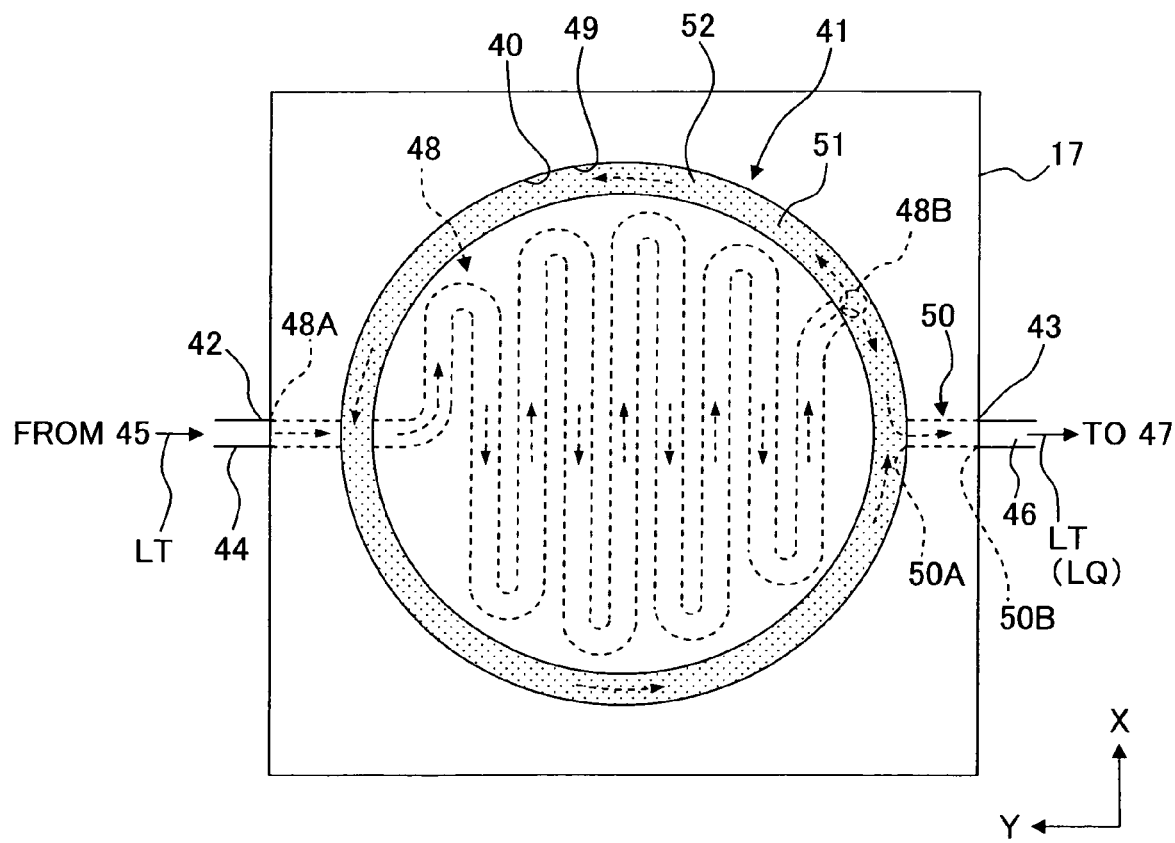
FIG. 4 schematically illustrates an internal flow passage according to the first embodiment.

Next, an explanation will be made with reference to FIGS. 1 to 4 about the internal flow passage 41 and the second recovery port 40 provided on the substrate table 17. FIG. 3 is a side sectional view of those disposed in the vicinity of the second recovery port 40. FIG. 4 is a plan view schematically illustrating the substrate table 17.

The substrate table 17 is provided with the second recovery port 40 to recover the first liquid LQ. The second recovery port 40 recovers the first liquid LQ leaked from the gap G formed around the substrate P held by the substrate table 17 (first holding portion 31).

As described above, the size of the gap G is optimized, and the first liquid LQ is suppressed from entering the gap G. However, in a case that the circumferential edge area of the surface of the substrate P is not liquid-repellent as described above, there is such a possibility that the first liquid LQ might enter, from the gap G, into the space under or below the gap G depending on the state of the film formed on the base member (wafer) W and/or the shape of the edge of the substrate P. The first liquid LQ, which is supplied to the surface of the substrate P and the surface of the plate member T, can be recovered by the first recovery port 22. On the other hand, it is difficult to recover the first liquid LQ inflowed into the gap G or the space under or below the gap G by the first recovery port 22. In this embodiment, the second recovery port 40 is arranged in the substrate table 17. Therefore, the first liquid LQ, which inflowed into the space on the back surface side of the substrate P from the gap G, can be recovered from the second recovery port 40.

The second recovery port 40 is arranged in a predetermined area of the upper surface 19 of the base member 18. In this embodiment, the second recovery port 40 is arranged around the first rim portion 34. In this embodiment, the second recovery port 40 is arranged between the first rim portion 34 of the first holding portion 31 and the second rim portion 36 of the second holding portion 32. As shown in FIG. 4, the second recovery port 40 is annular in the XY plane.

As shown in FIG. 3, in this embodiment, the second recovery port 40 is arranged at a position opposite to or facing the circumferential edge area (edge area) of the back surface of the substrate P and the inner edge area (edge area disposed on the inner side) of the back surface of the plate member T. That is, in this embodiment, the second recovery port 40 is arranged under or below the gap G. In other words, the second recovery port 40 is arranged to face or be opposite to the gap G.

The internal flow passage 41 is formed at the inside of the substrate table 17 (base member 18). The second liquid LT is made to flow through the internal flow passage 41 in order to adjust the temperature of the substrate table 17. From this viewpoint, it is preferable that the substrate table 17 is formed of a material having a high thermal conductivity so that the substrate table 17 is subjected to the temperature adjustment or regulation by the temperature of the liquid flowing through the internal flow passage 41. The substrate table 17 may be formed of, for example, aluminum, titanium, stainless steel, duralumin, and an alloy thereof. Further, the substrate table 17 is formed with a second supply port 42 via which the second liquid LT is supplied to the internal flow passage 41, and a discharge port 43 via which the liquid flowing through the internal flow passage 41 is discharged. In this embodiment, the second supply port 42 is arranged on a side surface, of the substrate table 17, on the +Y side, at a predetermined position on the side surface. The discharge port 43 is arranged on a side surface, of the substrate table 17, on the −Y side, at a predetermined position on the side surface. In this embodiment, the position of the second supply port 42 in the Z axis direction is different from the position of the discharge port 43 in the Z axis direction. That is, the second supply port 42 is provided at a position lower than that of the discharge port 43.

The second supply port 42 may be provided at a position higher than that of the discharge port 43. Alternatively, the position of the second supply port 42 in the Z direction may be approximately same as the position of the discharge port 43 in the Z direction.

As shown in FIG. 2, in this embodiment, the second supply port 42 is connected to a second liquid supply device 45 via a flow passage 44. The flow passage 44 is constructed of a flexible tube so that the substrate stage 2 can be moved with respect to the second liquid supply device 45. The second liquid supply device 45 includes, in the inside thereof, a temperature-adjusting device for adjusting the temperature of the substrate table 17. The second liquid supply device 45 is capable of feeding the second liquid LT adjusted to have a predetermined temperature. As described above, the temperature of the first liquid LQ affects the refractive index of the first liquid LQ in the optical path for the exposure light in the liquid immersion space LS. Therefore, the temperature of the first liquid LQ is adjusted to the predetermined temperature by the first liquid supply device 24. If the temperature of the substrate P is different from the temperature of the first liquid LQ on the substrate P, then the temperature of the first liquid LQ is changed in some cases, and the substrate P is expanded or shrunk in other cases. Therefore, it is desirable that the temperature of the substrate P is same as the temperature of the first liquid LQ which is set as described above. Therefore, by setting the temperature of the second liquid LT, flowing through the substrate table 17 holding the substrate P, to be same as the set temperature of the first liquid LQ, it is possible to indirectly maintain the temperature of the substrate P at the temperature of the first liquid LQ. In this case, for example, the temperature of the second liquid LT may be adjusted with the second liquid supply device 45 so that the detected temperature of the substrate table 17 is same as that of the first liquid LQ supplied from the first liquid supply device 24, while detecting the temperature of the substrate table 17 by providing a temperature sensor for the substrate table 17. The temperature of the first liquid LQ may be different from the temperature of the second liquid LT. The flow passage 44 includes a flow passage which is formed by a supply tube connecting the second liquid supply device 45 and the second supply port 42. The second liquid LT fed from the second liquid supply device 45 is supplied to the second supply port 42 via the flow passage 44. A part of the internal flow passage 41 is connected to the second supply port 42. The second liquid supply device 45 supplies the second liquid LT to the internal flow passage 41 via the flow passage 44 and the second supply port 42.

The discharge port 43 is connected via a flow passage 46 to the second liquid recovery device 47. The flow passage 46 includes a flow passage which is formed by a discharge tube connecting the discharge port 43 and the second liquid recovery device 47. The discharge tube is formed of a flexible material so that the substrate stage 2 can be moved relative to the second liquid recovery device 47. A part of the internal flow passage 41 is connected to the discharge port 43. The second liquid recovery device 47, which is connected to the internal flow passage 41 via the flow passage 46 and the discharge port 43, is capable of recovering the liquid in the internal flow passage 41. The liquid discharged from the discharge port 43 is recovered by the second liquid recovery device 47 via the flow passage 46.

In this embodiment, the controller 8 controls the second liquid supply device 45 and the second liquid recovery device 47 so that the internal flow passage 41 is filled with the second liquid LT. The controller 8 executes the liquid recovery operation performed by the second liquid recovery device 47 concurrently with the liquid supply operation performed by the second liquid supply device 45 so that the internal flow passage 41 is filled with the second liquid LT. Accordingly, the internal flow passage 41 is filled with the second liquid LT.

In this embodiment, a part of the internal flow passage 41 is connected to the second recovery port 40. In this embodiment, as shown in FIGS. 3 and 4, etc., the internal flow passage 41 has a bent portion 48 which has one end 48A and the other end 48B, the one end 48A being connected to the second supply port 42; a groove 49 which is connected to the other end 48B of the bent portion 48 and which is formed on the upper surface 19 of the base member 18; and a discharge portion 50 which has one end 50A and the other end 50B, the one end 50A being connected to the groove 49 and the other end 50B being connected to the discharge port 43.

As shown in FIG. 4, the bent portion 48 has a plurality of portions which are bent in the XY plane. The second supply port 42 supplies the second liquid LT to the one end 48A of the bent portion 48. The second liquid LT, which is supplied to the one end 48A of the bent portion 48, is allowed to flow through the bent portion 48. The bent portion 48 is arranged so that the second liquid LT is pervaded to the approximately entire region of the first holding portion 31. Accordingly, the temperature of the first holding portion 31 is adequately adjusted by the second liquid LT.

The groove 49 is arranged between the first rim portion 34 and the second rim portion 36. The groove 49 is annular in the XY plane. In this embodiment, the second recovery port 40 includes an opening of the groove 49 arranged on the upper surface 19 of the base member 18. In this embodiment, the groove 49 of the first flow passage 41 is connected to the second recovery port 40.

The other end 48B of the bent portion 48 is connected to the lower surface of the groove 49. The second liquid LT flowing through the bent portion 48 is made to flow into the groove 49 from the other end 48B. The second liquid LT, which inflowed into the groove 49 from the other end 48B of the bent portion 48, flows through the groove 49. The second liquid LT flows so that the groove 49 is filled with the second liquid LT. As shown in FIG. 4, the second liquid LT, which inflowed into the groove 49 from the other end 48B of the bent portion 48, flows to travel around the first holding portion 31 along the groove 49. A part of the liquid flowing through the groove 49 is made to inflow into the discharge portion 50 from one end 50A of the discharge portion 50. In this embodiment, the position of the other end 48B of the bent portion 48 is different from the position of one end 50A of the discharge portion 50 in the XY plane. By doing so, the second liquid LT is facilitated to flow and move around the first holding portion 31 along the groove 49. The liquid, inflowed into the discharge portion 50 from the one end 50A of the discharge portion 50, flows through the discharge portion 50, and is discharged to the flow passage 46 from the other end 50B via the discharge port 43. The liquid, which is discharged to the flow passage 46, is recovered by the second liquid recovery device 47.

In this embodiment, the first liquid LQ, which is recovered from the second recovery port 40, flows through the internal flow passage 41 (groove 49 and discharge portion 50) together with the second liquid LT, and is recovered by the second liquid recovery device 47 via the flow passage 46. In this embodiment, the first liquid LQ and the second liquid LT are liquids of the same type. In this embodiment, the first liquid LQ and the second liquid LT are water (pure or purified water). Therefore, each of the first liquid LQ and the second liquid LT can flow smoothly through the internal flow passage 41. The second liquid recovery device 47 can smoothly recover each of the first liquid LQ recovered from the second recovery port 40 and the second liquid LT supplied from the second liquid supply device 45.

In this embodiment, a plate-shaped porous member 51, which includes a plurality of openings or pores, is arranged in the second recovery port 40. The porous member 51 includes a mesh filter having a large number of small openings or pores formed in a mesh form. By arranging the porous member 51 in the second recovery port 40, the bubbles are suppressed from inflowing into the internal flow passage 41 via the second recovery port 40, as described later on. As shown in FIG. 4, the porous member 51 is annular in the XY plane.

As shown in FIG. 3, the porous member 51 has an upper surface 52 which faces or is opposite to the edge area of the back surface of the substrate P and the edge area of the back surface of the plate member T, a lower surface 53 which faces the internal flow passage 41 (groove 49), and the plurality of openings or pores 54 which make communication between the upper surface 52 and the lower surface 53. The lower surface 53 of the porous member 51 makes contact with the liquid contained in the internal flow passage 41. In this embodiment, each of the upper surface 52 and the lower surface 53 is substantially parallel to the XY plane.

Those usable as the porous member 51 include, for example, a sintered member (for example, a sintered metal) having a large number of pores formed therein, and a porous or foamed member (for example, a porous or foamed metal), etc.

Figure 5:
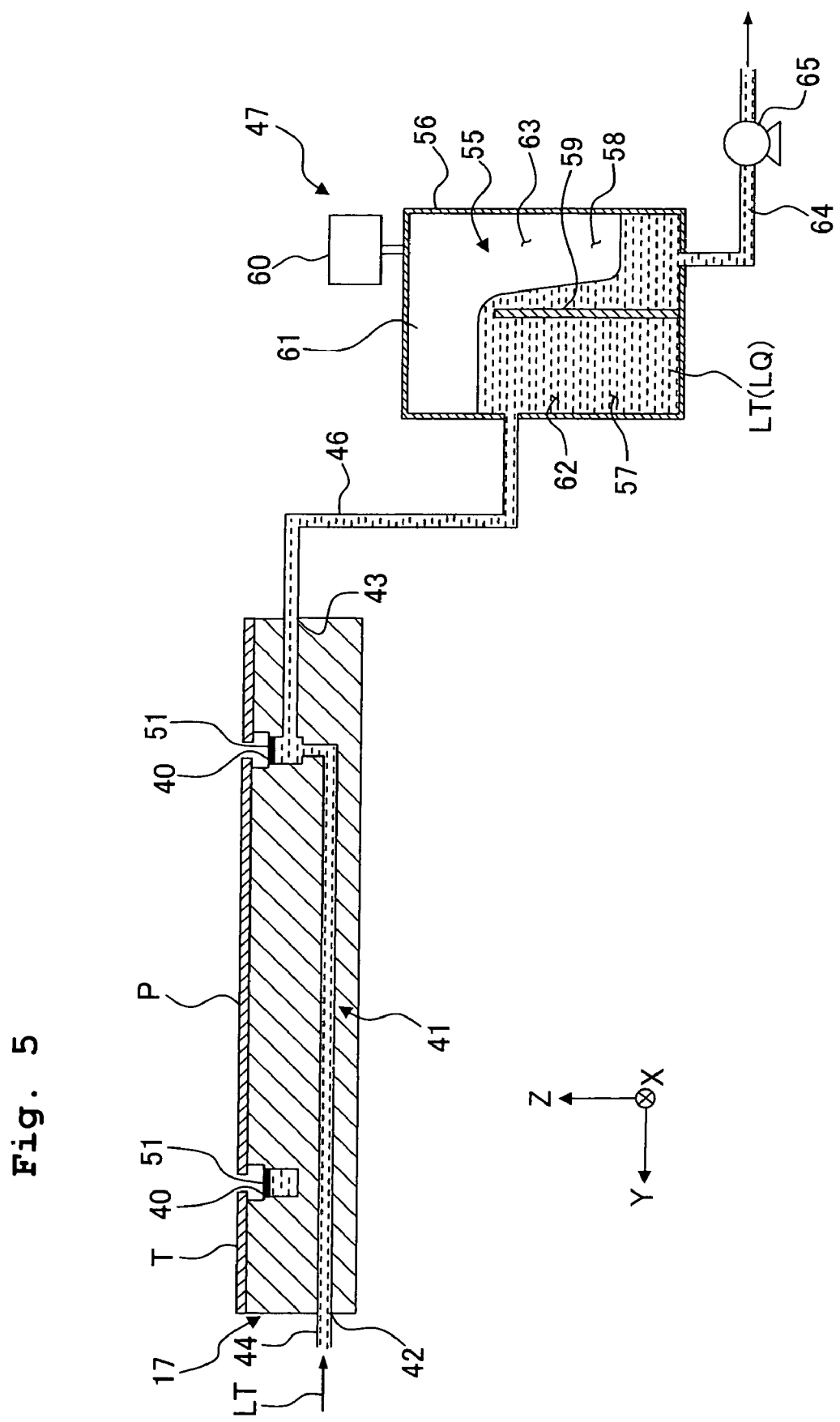
FIG. 5 schematically shows an example of a second liquid recovery device according to the first embodiment.

FIG. 5 shows an example of the second liquid recovery device 47 according to this embodiment. In this embodiment, the second liquid recovery device 47 is capable of adjusting or regulating the pressure in the internal flow passage 41 (pressure of the medium (liquid) existing in the internal flow passage 41). That is, in this embodiment, the second liquid recovery device 47 functions as a pressure-adjusting device which is capable of adjusting the pressure of the internal flow passage 41.

With reference to FIG. 5, the second liquid recovery device 47 includes a tank 56 which has an internal space 55; a comparting member 59 which is arranged in the internal space 55 in the vertical direction and which divides a part of the internal space 55 into a first space 57 and a second space 58; and a regulator 60 which is connected to the internal space 55. The internal flow passage 41 is connected to the first space 57 via the flow passage 46. The liquid, discharged from the internal flow passage 41 via the discharge port 43, is allowed to inflow into the first space 57 via the flow passage 46. A flow passage 61, which makes communication between the first space 57 and the second space 58, is provided between the upper end of the comparting member 59 and the inner surface of the tank 56. The liquid, inflowed into the first space 57 from the internal flow passage 41, overflows from the first space 57, and inflows into the second space 58 via the flow passage 61.

In this embodiment, the internal space 55 is not filled with the liquid. The liquid exists in a part (portion) of the space of the internal space 55, and a gas (for example, the air) exists in the other part (portion) of the internal space 55. That is, a liquid space 62 and a gas space 63 are formed in the internal space 55. In this embodiment, all of the first space 57 is filled with the liquid, and a part of the second space 58 is filled with the liquid. That is, the liquid space 62 is formed in the first space 57 and a part of the second space 58. The gas space 63 is formed in a part of the second space 58. In this embodiment, the liquid space 62 is formed at a lower portion of the internal space 55 in accordance with the action of the gravity. The liquid from the internal flow passage 41 overflows from the first space 57, flows over the upper end of the comparting member 59, and inflows into the second space 58. With this, the height of the surface (interface) of the liquid in the internal space 55 is maintained to be approximately constant (at a height approximately same as the height of the comparting member 59 of the first space 57). In this embodiment, the gas is prevented from flowing into the internal flow passage 41 by using the porous member 51. However, even if the gas inflows into the internal flow passage 41 due to any cause, such a gas is subjected to the gas-liquid separation in the internal space 55 of the tank 56.

The internal flow passage 41 is connected to the liquid space 62 via the flow passage 46. The regulator 60 is connected to the gas space 63 in the tank 56. The regulator 60 adjusts the pressure of the gas space 63. The controller 8 can adjust the pressure of the internal space 55 (gas in the gas space 63) with the regulator 60, to thereby adjust the pressure of the internal flow passage 41 connected to the internal space 55.

In this embodiment, the upper end of the comparting member 59 is arranged on the –Z side with respect to the upper surface 52 of the porous member 51. Accordingly, for example, even when any abnormality or the like arises in the regulator 60, it is possible to suppress the backflow or reverse flow of the liquid in the tank 56 to the internal flow passage 41, and it is possible to suppress the overflow of the liquid in the internal flow passage 41 to the upper surface 52 of the porous member 51.

In this embodiment, a flow passage 64 of a discharge tube is connected to the lower surface of the second space 58. A suction device 65 including a vacuum system, etc. is arranged in the flow passage 64. The suction device 65 is capable of sucking and discharging the liquid in the internal space 55 of the tank 56 via the flow passage 64 by a predetermined suction force. The suction device 65 discharges the liquid so that the height of the liquid (liquid level) in the second space 58 is approximately constant by providing, for example, a liquid level sensor for the tank 56.

In this embodiment, the controller 8 controls the second liquid recovery device 47 including the regulator 60 so that the internal flow passage 41 is adjusted to have a predetermined negative pressure. In this embodiment, the pressure of the internal space 13 around the substrate stage 2 is adjusted to be approximately the atmospheric pressure by the chamber device 14. The controller 8 performs the adjustment so that the pressure of the internal flow passage 41 is the pressure lower than the atmospheric pressure.

In this embodiment, the controller 8 adjusts the pressure of the internal flow passage 41 so that the first liquid LQ is recovered from the second recovery port 40. In this embodiment, the porous member 51 is provided on the second recovery port 40. Therefore, the controller 8 adjusts the pressure difference between the upper surface 52 and the lower surface 53 of the porous member 51 so that the first liquid LQ is recovered from the second recovery port 40.

In this embodiment, the controller 8 adjusts the pressure of the internal flow passage 41 by using the second liquid recovery device 47 so that the gas is not allowed to inflow into the internal flow passage 41 via the porous member 51, i.e., so that only the first liquid LQ is recovered from the second recovery port 40 in which the porous member 51 is arranged.

In this embodiment, the controller 8 adjusts the difference between the pressure applied to the upper surface 52 of the porous member 51 and the pressure applied to the lower surface 53 of the porous member 51 by using the second liquid recovery device 47 so that the gas is not recovered from the second recovery port 40. In this embodiment, the upper surface 52 of the porous member 51 is arranged adjacently to the internal space 13 in which the pressure is adjusted by the chamber device 14. The lower surface 53 is arranged adjacently to the internal flow passage 41 in which the pressure is adjusted by the second liquid recovery device 47. That is, the space, which is on the side of the upper surface 52, includes a part of the internal space 13, and the space, which is on the side of the lower surface 53, includes a part of the internal flow passage 41. The controller 8 can adjust the pressure of the internal flow passage 41, as the space on the side of the lower surface 53, with the second liquid recovery device 47 to thereby adjust the difference between the pressure of the space on the side of the upper surface 52 of the porous member 51 and the pressure of the space on the side of the lower surface 53 of the porous member 51.

In this embodiment, the controller 8 adjusts the pressure of the internal flow passage 41 so that only the first liquid LQ is recovered via the porous member 51 depending on the characteristic of the first liquid LQ and the characteristic of the porous member 51.

Figure 6:
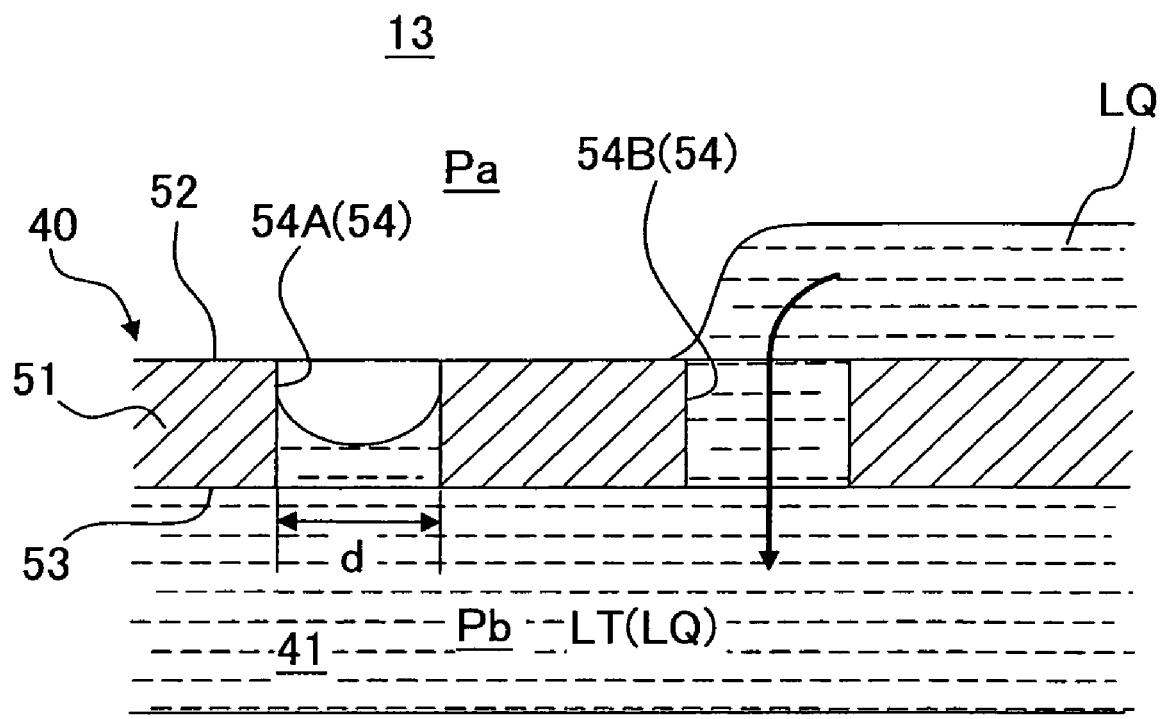
FIG. 6 schematically illustrates the liquid recovery operation performed via a porous member, according to the first embodiment.

An explanation will be made below with reference to FIG. 6 about the principle of the liquid recovery operation using the second recovery port 40. FIG. 6 is a sectional view of those obtained by magnifying a part of the porous member 51, and schematically explains the liquid recovery operation performed via the porous member 51.

With reference to FIG. 6, the gas space and the liquid space are formed on the side of the upper surface 52 of the porous member 51. The gas space is formed to include a first pore 54A of the plurality of pores 54 of the porous member 51, and the liquid space is formed to include a second pore 54B among the plurality of pores 54. The liquid space on the side of the upper surface 52 is formed, for example, by the first liquid LQ inflowed onto the porous member 51 via the gap G.

In a case assuming that Pa represents the pressure of the gas space including the first pore 54A of the porous member 51 (pressure applied to the upper surface 52); Pb represents the pressure of the internal flow passage 41 (pressure applied to the lower surface 53); d represents the pore size (diameter) of each of the pores 54A, 54B; θ represents the contact angle of the porous member 51 (inner side surface of the pore 54) with respect to the first liquid LQ; and γ represents the surface tension of the first liquid LQ. On this assumption, in this embodiment, the following condition is satisfied:

$$(4 \times \gamma \times \cos \theta)/d \geq (Pb - Pa) \quad (1)$$

In the expression (1), in order to simplify the explanation, the hydrostatic pressure of the liquid on the side of the lower surface 53 of the porous member 51 is not considered.

In this case, the contact angle θ of the porous member 51 (inner side surface of the pore 54) with respect to the first liquid LQ satisfies the following condition.

$$\theta \leq 90° \quad (2)$$

When the foregoing conditions hold, even in a case that the gas space is formed on the side of the upper surface 52 of the first pore 54A of the porous member 51, the gas, existing in the gas space on the side of the upper surface 52 of the porous member 51, is suppressed from moving to (inflow into) the internal flow passage 41 on the side of the lower surface 53 of the porous member 51 via the first pore 54A. That is, by optimizing the pore size d of the porous member 51, the contact angle (affinity) θ of the porous member 51 with respect to the first liquid LQ, the surface tension γ of the first liquid LQ, and the pressures Pa, Pb so that the foregoing conditions are satisfied, it is possible to maintain the interface between the first liquid LQ and the gas at the inside of the first pore 54A of the porous member 51. With this, the inflow of the gas from the internal space 13 into the internal flow passage 41 via the first pore 54A is suppressed. On the other hand, the liquid space is formed on the side of the upper surface 52 of the second pore 54B of the porous member 51. Therefore, only the first liquid LQ can be recovered via the second pore 54B.

In this embodiment, the pressure Pa of the gas space on the side of the upper surface 52 of the porous member 51, the pore size d, the contact angle θ of the porous member 51 (inner side surface of the pore 54) with respect to the first liquid LQ, and the surface tension γ of the first liquid LQ are approximately constant. The controller 8 controls the suction force of the second liquid recovery device 47 to adjust the pressure (pressure of the internal flow passage 41) Pb applied to the lower surface 53 of the porous member 51 so that the foregoing conditions are satisfied.

In the expression (1) described above, as (Pb−Pa) is greater, namely as ((4×γ×cos θ)/d) is greater, the control of the pressure Pb to satisfy the foregoing conditions becomes easier. Therefore, it is desirable that the pore size d is made to be as small as possible, and that the contact angle θ of the porous member 51 with respect to the first liquid LQ is made to be as small as possible. In this embodiment, the porous member 51 is liquid-attractive with respect to the first liquid LQ, and the porous member 51 has a sufficiently small contact angle θ. For example, the contact angle of the first liquid LQ on the surface of the porous member 51 is not more than 20 degrees. The porous member 51 can be formed of a liquid-attractive material, for example, titanium dioxide which has a high hydrophilicity with respect to water. Alternatively, the body of the porous member 51, which is formed of, for example, ceramics, plastic, or metal, may be subjected to a liquid-attracting treatment with a liquid-attractive material such as $MgF_2$, $Al_2O_3$, $SiO_2$, etc.

As described above, in this embodiment, the pressure difference between the space on the side of the upper surface 52 of the porous member 51 (gas space of the internal space 13) and the space on the side of the lower surface 53 (internal flow passage 41) is controlled so that the foregoing conditions are satisfied in the state that the porous member 51 is wet. Accordingly, it is possible to recover only the first liquid LQ via the pores 54 of the porous member 51.

The state shown in FIG. 6 is referred to by way of example. Only the liquid space is formed on the upper surface of the porous member 51 in some cases, and only the gas space is formed on the upper surface of the porous member 51 in other cases.

Next, an explanation will be made about an example of the operation of the exposure apparatus EX constructed as described above. The controller 8 operates the second liquid supply device 45 to supply the second liquid LT to the internal flow passage 41 provided on the substrate table 17. The second liquid LT is allowed to flow through the internal flow passage 41. With this, the temperature of the substrate table 17 is adjusted.

Further, the controller 8 executes the liquid recovery operation performed by the second liquid recovery device 47 concurrently with the liquid supply operation performed by the second liquid supply device 45 so that the internal flow passage 41 is filled with the second liquid LT. Accordingly, the internal flow passage 41 is filled with the second liquid LT, and the porous member 51 and the second liquid LT in the internal flow passage 41 make contact with each other. Further, the controller 8 uses the second liquid recovery device 47 to thereby make the space in the internal flow passage 41 have the predetermined negative pressure.

The controller 8 loads a substrate P before the exposure on the first holding portion 31 with a predetermined transport device. The substrate P is held by the first holding portion 31. The plate member T is held by the second holding portion 32 at a predetermined timing before the substrate P is held by the first holding portion 31.

In order to perform the liquid immersion exposure for the substrate P held by the first holding portion 31, the controller 8 forms the liquid immersion space LS with the first liquid LQ between the final optical element 10 and the liquid immersion member 9 as one side of the liquid immersion space LS and at least one of the substrate P and the plate member T as the other side of the liquid immersion space LS. Accordingly, the optical path, for the exposure light EL, which is between the final optical element 10 and the substrate P, is filled with the first liquid LQ.

The controller 8 causes the exposure light EL to be irradiated from the illumination system IL in the state that the optical path for the exposure light EL is filled with the first liquid LQ. The mask M is illuminated with the exposure light EL irradiated from the illumination system IL. The exposure light EL via the mask M is irradiated onto the substrate P via the projection optical system PL and the first liquid LQ in the liquid immersion space LS. Accordingly, the image of the pattern of the mask M is projected onto the substrate P, and the substrate P is exposed with the exposure light EL.

In a case that the liquid immersion space LS is formed on the gap G, there is such a possibility that the first liquid LQ might inflow from the gap G. In this embodiment, the first liquid LQ, inflowed from the gap G, flows and falls to the upper surface 52 of the porous member 51, is moved to the internal flow passage 41 (groove 49) via the pores 54 of the porous member 51, and is recovered. Therefore, the first liquid LQ, inflowed from the gap G, can be suppressed, for example, from remaining in the space between the first rim portion 34 and the second rim portion 36, from inflowing into the space between the back surface of the substrate P and the first holding portion 31, from remaining on at least one of the back surface of the substrate P and the first holding portion 31, from inflowing into the space between the back surface of the plate member T and the second holding portion 32, and from remaining on at least one of the back surface of the plate member T and the second holding portion 32. Therefore, it is possible to suppress any harmful influence which would be otherwise caused by the vaporization of the first liquid LQ inflowed from the gap G. It is possible to suppress, for example, the change of the temperature of the substrate P, the change of the temperature of the plate member T, and the change of the temperature of the base member 18 which would be otherwise caused by the vaporization of the first liquid LQ.

In this embodiment, the adjustment is made such that the second recovery port 40 recovers only the first liquid LQ and the second recovery port 40 does not recover the gas. Therefore, the first liquid LQ, inflowed from the gap G, is suppressed from the vaporization, and thus it is possible to effectively suppress the harmful influence caused by the vaporization. For example, in a case that the second recovery port 40 recovers the first liquid LQ and the gas together, then the first liquid LQ tends to be vaporized in the vicinity of the second recovery port 40 and/or at the internal flow passage 41, etc., and the possibility of the generation of the heat of vaporization is raised. In this embodiment, the gas is not recovered from the second recovery port 40. Therefore, it is possible to effectively suppress the temperature change of the substrate P, the temperature change of the plate member T, and the temperature change of the base member 18 which would be otherwise caused by the vaporization of the first liquid LQ inflowed from the gap G. Further, by recovering only the first liquid LQ, it is also possible to suppress the generation of the vibration.

In this embodiment, the second liquid LT for adjusting the temperature of the substrate table 17 flows through the internal flow passage 41. Therefore, it is possible to more effectively suppress the temperature change of the substrate table 17 and the substrate P held by the substrate table 17. Further, the internal flow passage 41, through which the temperature-adjusted second liquid LT flows, is connected to the second recovery port 40. Therefore, it is possible to sufficiently suppress the temperature change in the vicinity of the porous member 51 and the second recovery port 40. That is, a sufficient amount of the second liquid LT flows through the internal flow passage 41 connected to the second recovery port 40. Therefore, owing to the second liquid LT, it is possible to sufficiently suppress the temperature change of the base member 18, etc. which would be otherwise caused by the heat of vaporization of the first liquid LQ. Further, the internal flow passage 41 through which the second liquid LT flows and the recovery flow passage through which the first liquid LQ, recovered from the second recovery port 40, flows are used partially commonly. Therefore, it is also possible to suppress the increase in the size of the base member 18.

After the exposure is completed for the substrate P, the controller 8 unloads the exposed substrate P from the first holding portion 31 with the predetermined transport device. Thus, the exposure process is completed for the substrate P.

As explained above, according to this embodiment, even when the first liquid LQ inflows into the space on the back surface side of the substrate P, it is possible to satisfactorily recover then the first liquid LQ by the second recovery port 40 provided for the substrate table 17, and it is possible to suppress the influence of the vaporization of the first liquid LQ. Therefore, it is possible to suppress the occurrence of the exposure failure, and it is possible to suppress the production or occurrence of defective device.

According to this embodiment, the second recovery port 40 is connected to the internal flow passage 41 through which the second liquid LT flows in order to adjust the temperature of the substrate table 17. Therefore, it is possible to sufficiently suppress the temperature change of the substrate table 17 and the substrate P, by the recovery process for recovering the first liquid LQ using the second recovery port 40 and the temperature-adjusting process based on the second liquid LT flowing through the internal flow passage 41. In particular, the second recovery port 40 is connected to the internal flow passage 41 through which the second liquid LT flows in order to adjust the temperature of the substrate table 17. Therefore, not only the second liquid LT but also the first liquid LQ can be simultaneously recovered from the internal flow passage 41. As a result, a synergistic effect is provided such that the flow passage and the liquid recovery motive force can be provided commonly. Accordingly, it is possible to further simplify the structures of the stage apparatus and the exposure apparatus. The temperature change of the substrate, which is caused by various causes including the vaporization of the liquid, can be further avoided by providing the second recovery port 40 and allowing the temperature-controlled liquid to flow through the internal flow passage 41 to which the second recovery port 40 is faced.

In this embodiment, for example, a temperature sensor, which is capable of detecting the temperature of the substrate table 17, may be provided. The temperature of the second liquid LT supplied to the internal flow passage 41 can be adjusted based on a result of detection performed by the temperature sensor.

The temperature of the second liquid LT may be adjusted based on the temperature of the first liquid LQ supplied from the first supply port 21 and/or the temperature of the substrate P held by the substrate table 17. In this embodiment, the plate member T, which is releasable from the substrate table, is used. However, the plate member T may be omitted. It is enough that the substrate table has a portion with which the plate member T is substitutable.

Second Embodiment

Next, a second embodiment will be explained. In the following explanation, the constitutive components or parts, which are same as or equivalent to those of the embodiment described above, are designated by the same reference numerals, any explanation of which will be simplified or omitted.

Figure 7:
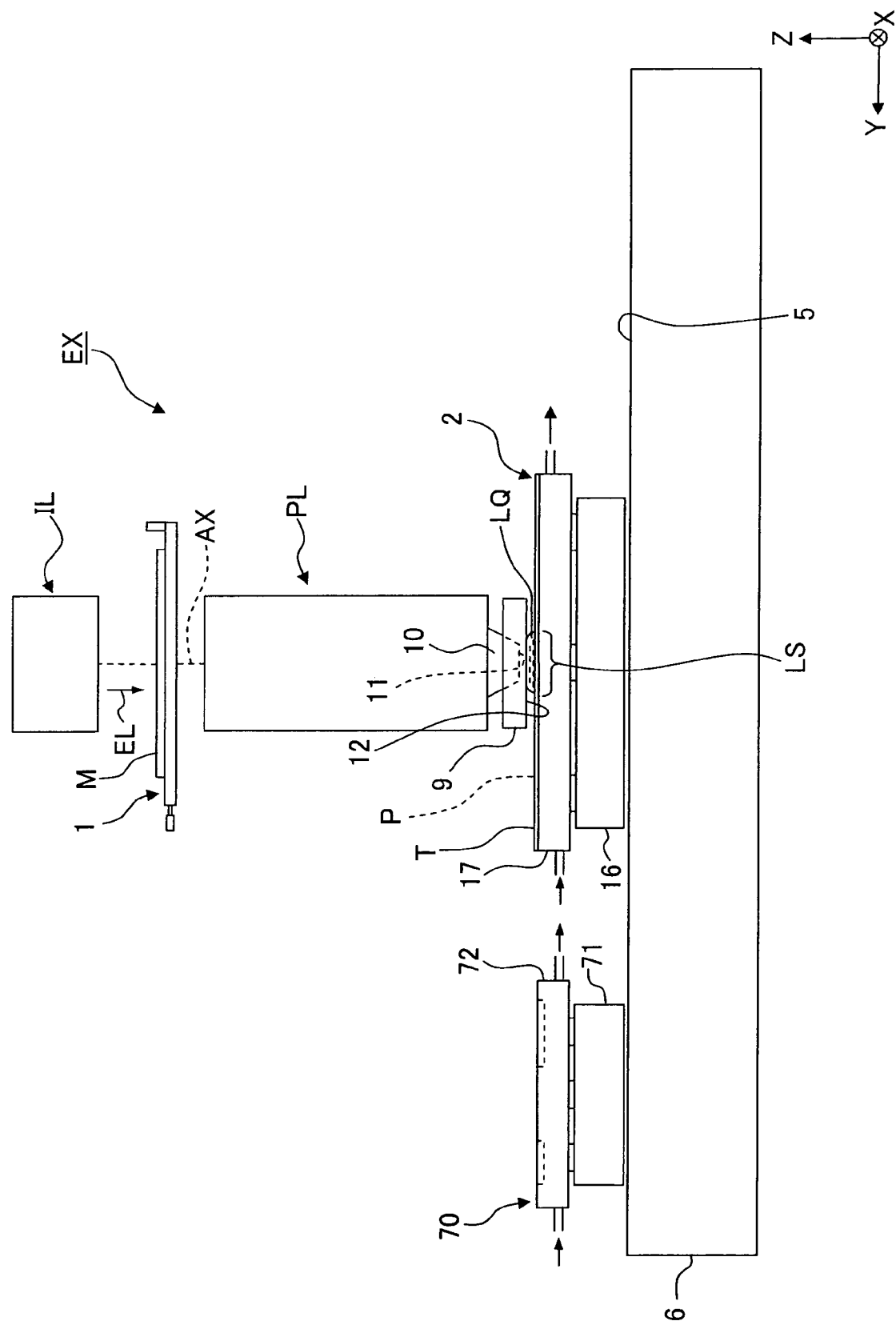
FIG. 7 shows a schematic construction of an example of an exposure apparatus according to a second embodiment.

FIG. 7 shows a schematic construction illustrating an example of an exposure apparatus EX according to the second embodiment. The exposure apparatus EX according to the second embodiment is an exposure apparatus including a substrate stage 2 which is movable while holding a substrate P, and a measuring stage 70 which does not hold the substrate P and which is movable while mounting thereon a measuring unit or device and a measuring member capable of executing a predetermined measurement in relation to the exposure, as disclosed, for example, in U.S. Pat. No. 6,897,963 and European Patent Application Publication No. 1713113.

The measuring stage 70 has a stage body 71, and a measuring table 72 which is provided on the stage body 71 and on which a measuring device and a measuring member can be mounted. The stage body 71 is supported in a non-contact manner on a guide surface 5 by a gas bearing. The stage body 71 is movable in the XY directions on the guide surface 5. The measuring stage 70 is movable along the guide surface 5 in the XY plane including the irradiation position of the exposure light EL irradiated from the light-exit surface 11 of the final optical element 10 in the state that the measuring device and the measuring member are mounted on the measuring stage 70.

Figure 8:
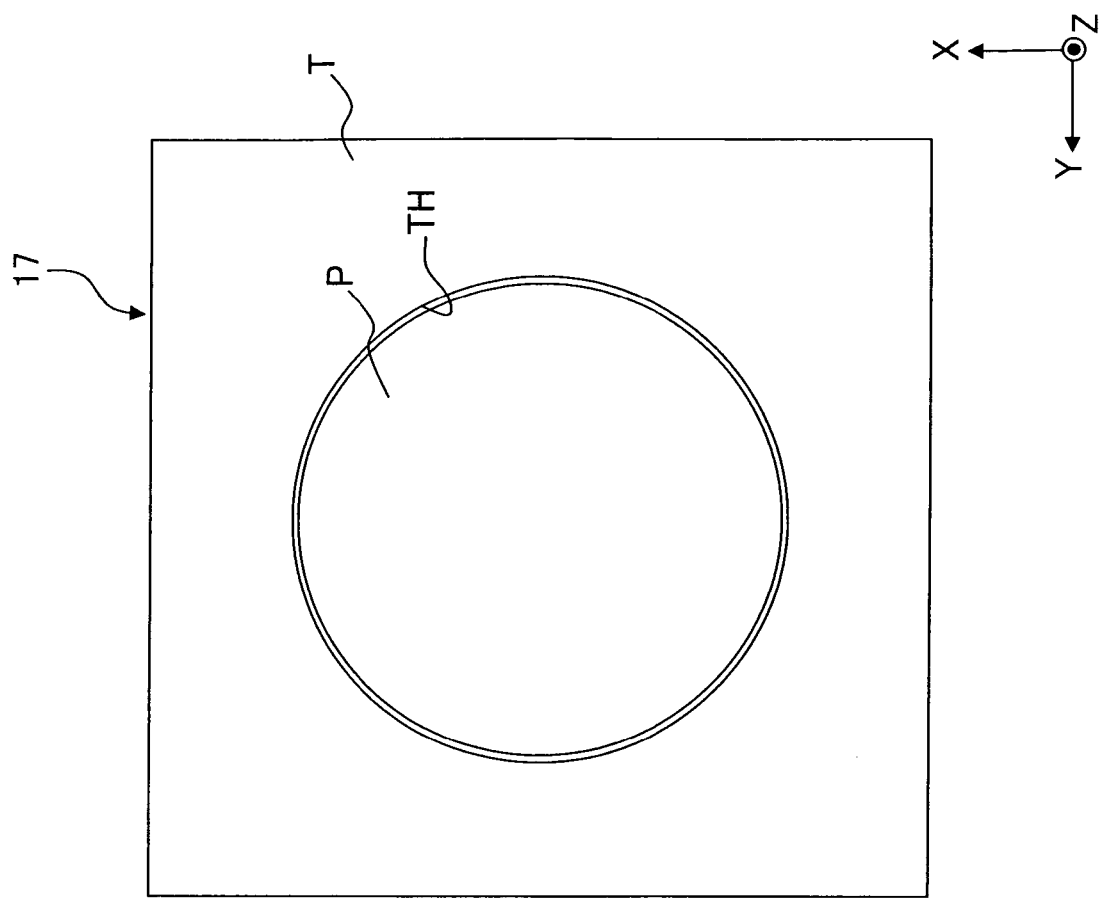
FIG. 8 is a plan view of a substrate table and a measuring table according to the second embodiment.
Figure 8:
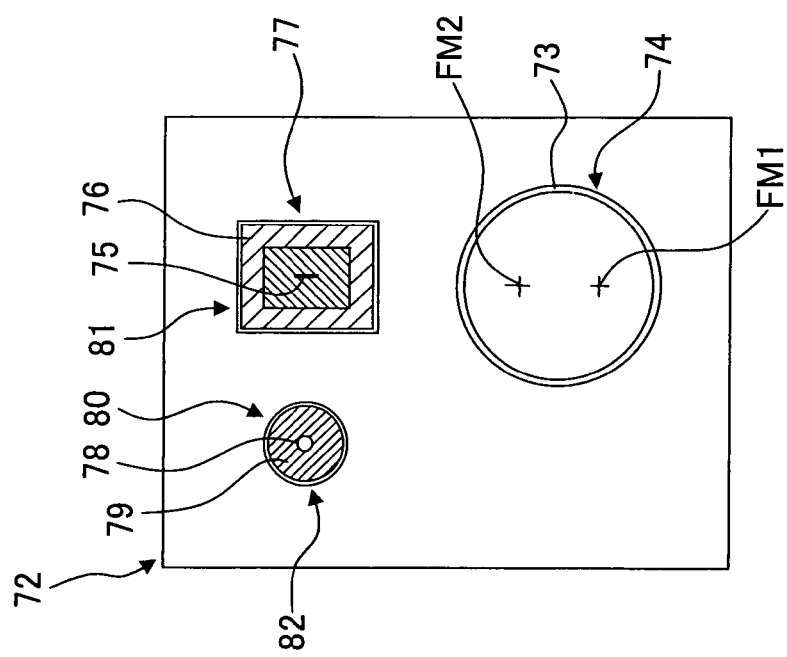

FIG. 8 is a plan view of the substrate table 17 and the measuring table 72 as viewed from an upper position. As shown in FIG. 8, a reference plate 73, which is formed with a plurality of reference marks FM1, FM2, is provided, as the measuring member, on the upper surface of the measuring table 72 at a predetermined position of the upper surface. In this embodiment, the reference plate 73 is releasably held by a third holding portion 74 provided on the measuring table 72. A slit plate 76, which is formed with a slit portion 75 capable of transmitting the light therethrough, is provided, as the measuring member, on the upper surface of the measuring table 72 at a predetermined position of the upper surface. In this embodiment, the slit plate 76 is releasably held by a fourth holding portion 77 provided on the measuring table 72. An upper plate 79, which is formed with an aperture pattern 78 capable of transmitting the light therethrough, is provided, as the measuring member, on the upper surface of the measuring table 72 at a predetermined position of the upper surface. In this embodiment, the upper plate 79 is releasably held by a fifth holding portion 80 provided on the measuring table 72. At least one of the reference plate 73, the slit plate 76, and the upper plate 79 may be fixed so that at least one of the reference plate 73, the slit plate 76, and the upper plate 79 cannot be released.

The first reference mark FM1 of the reference plate 73 is measured by an alignment system of the VRA (Visual Reticle Alignment) system in which a light (light beam) is irradiated onto an objective mark, and the image data of the mark photographed or imaged, for example, by a CCD camera is subjected to the image processing to detect the position of the mark, as disclosed in U.S. Pat. No. 5,646,413, etc. The second reference mark FM2 is measured by an alignment system of the FIA (Field Image Alignment) system in which a broadband detecting light beam, which does not photosensitive the photosensitive film Rg of the substrate P, is irradiated onto an objective mark; in which an image of the objective mark focused or imaged on a light-receiving surface by the reflected light beam from the objective mark and an image of the index are imaged by using an image pickup device such as CCD so that the image pickup signals thereof are subjected to the image processing to measure the position of the mark, as disclosed, for example, in U.S. Pat. No. 5,493,403. When the measurement process using the reference plate 73 is executed, the liquid immersion space LS is formed with the first liquid LQ between the final optical element 10 and the liquid immersion member 9 and the reference plate 73. The exposure light EL is irradiated onto the reference plate 73 through the first liquid LQ.

The slit plate 76 constructs a part of a spatial image-measuring system 81 as disclosed, for example, in United States Patent Application Publication No. 2002/0041377. When the measurement process using the slit plate 76 is executed, the liquid immersion space LS is formed with the first liquid LQ between the final optical element 10 and the liquid immersion member 9 and the slit plate 76. The exposure light EL is irradiated onto the slit plate 76 through the first liquid LQ.

The upper plate 79 constructs a part of a measuring system 82 capable of measuring the uneven illuminance of the exposure light EL as disclosed, for example, U.S. Pat. No. 4,465,368. The upper plate 79 may construct a part of a radiation amount-measuring system as disclosed, for example, in United States Patent Application Publication No. 2002/0061469. Alternatively, the upper plate 79 may construct a part of a wavefront aberration-measuring system as disclosed, for example, in European Patent No. 1079223. When the measurement process using the upper plate 79 is executed, the liquid immersion space LS is formed with the first liquid LQ between the final optical element 10 and the liquid immersion member 9 and the upper plate 79. The exposure light EL is irradiated onto the upper plate 79 through the first liquid LQ.

Figure 9:
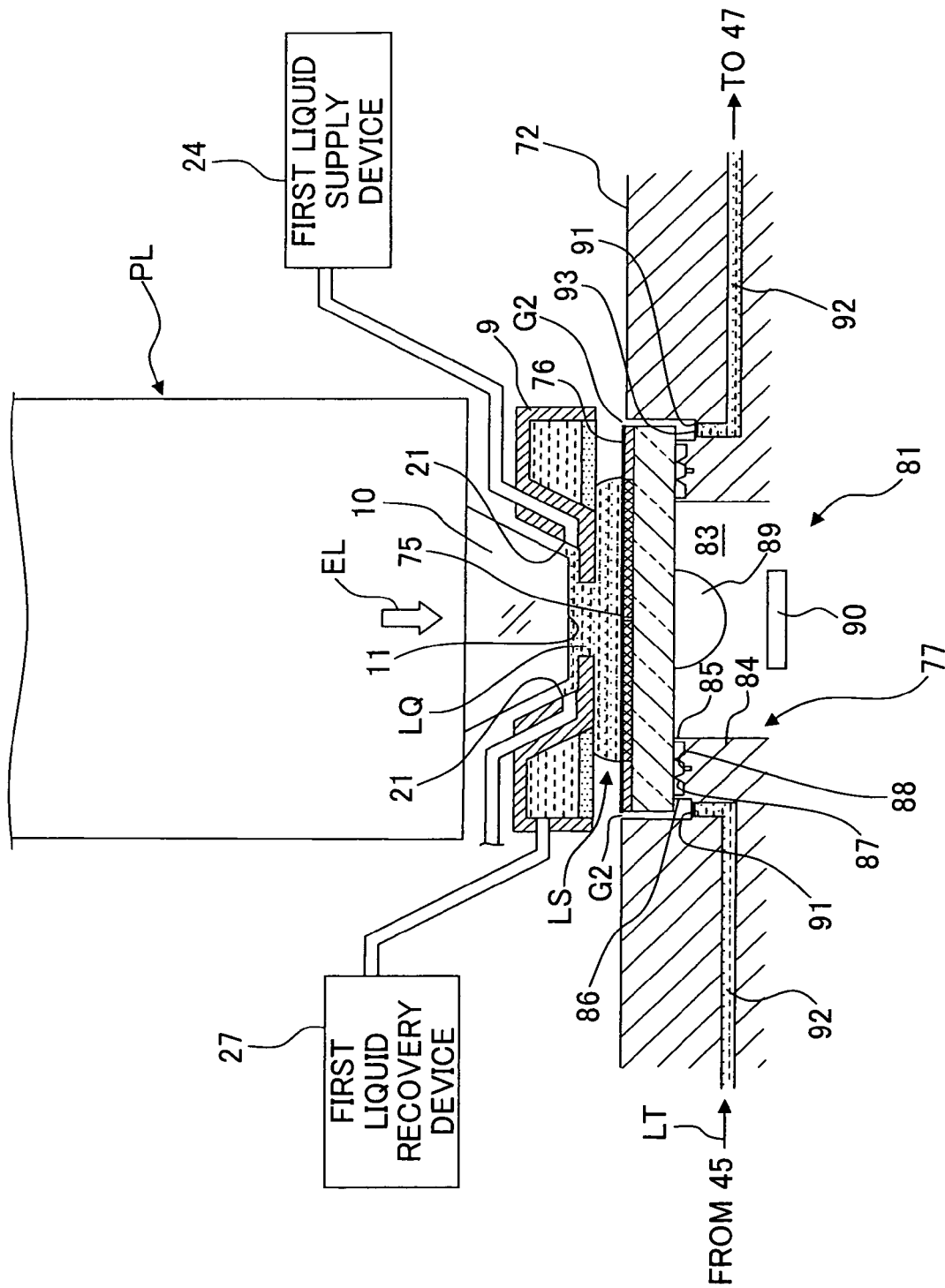
FIG. 9 is a side sectional view of those disposed in the vicinity of a second recovery port according to the second embodiment.

FIG. 9 is a sectional view of the slit plate 76 held by the fourth holding portion 77. As shown in FIG. 9, an opening is formed at a part of the upper surface of the measuring table 72. An internal space 83, which is connected to the opening, is formed in the measuring table 72. The slit plate 76 is releasably held by the fourth holding portion 77 arranged in the vicinity of the opening of the measuring table 72. The fourth holding portion 77 includes a so-called pin chuck mechanism. The fourth holding portion 77 has a base member 84 which is formed to have an annular form so that the exposure light EL transmitted through the slit portion 75 is not shielded or blocked; an inner rim portion 85 which is formed on the base member 84 to extend along the inner edge of the base member 84 and which has an annular upper surface opposite to or facing the back surface (lower surface) of the slit plate 76; an outer rim portion 86 which is formed on the base member 84 to surround the inner rim portion 85 and which has an annular upper surface opposite to or facing the back surface of the slit plate 76; a support portion 87 which is formed on the base member 84 between the inner rim portion 85 and the outer rim portion 86 and which includes a plurality of pin-shaped members supporting the back surface of the slit plate 76; and a sucking port 88 which is arranged on the base member 84 between the inner rim portion 85 and the outer rim portion 86 and which is capable of sucking the gas. The fourth holding portion 77 holds the slit plate 76 so that the surface of the slit plate 76 and the upper surface of the measuring table 72 are arranged substantially in a same plane. In this embodiment, the surface of the slit plate 76 and the upper surface of the measuring table 72 are substantially parallel to the XY plane.

At least a part of the spatial image-measuring system 81 is arranged in the internal space 83 of the measuring table 72. The spatial image-measuring system 81 is provided with the slit plate 76, an optical system 89 which is arranged under or below the slit portion 75 in the internal space 83 of the measuring table 72, and a light-receiving element 90 which is capable of receiving the light (exposure light EL) via the optical system 89.

In this embodiment, a part of the measuring table 72 is arranged around the slit plate 76 held by the fourth holding portion 77. In this embodiment, a predetermined gap G2 is formed between the surface of the slit plate 76 held by the fourth holding portion 77 and the upper surface of the measuring table 72. In this embodiment, the liquid immersion space LS is formed to range over the surface of the slit plate 76 and the upper surface of the measuring table 72 in some cases. In this embodiment, the size of the gap G2 is determined so that the first liquid LQ does not inflow into the gap G2 due to the surface tension of the first liquid LQ. The size of the gap G2 is, for example, not more than 1 mm. The surface of the slit plate 76 as one side forming the gap G2 and the upper surface of the measuring table 72 as the other side forming the gap G2 are each liquid-repellent with respect to the first liquid LQ. The inflow of the first liquid LQ into the gap G2 is suppressed by optimizing the size of the gap G2.

In this embodiment, a second recovery port 91 is arranged in the measuring table 72 to recover the first liquid LQ inflowed from the gap G2. An internal flow passage 92, through which the second liquid LT flows to adjust the temperature of the measuring table 72, is formed in the measuring table 72. The second recovery port 91 is arranged under or below the gap G2. A porous member 93 is arranged in the second recovery port 91 in the same manner as in the second recovery port 40 of the first embodiment.

The second liquid LT is supplied to the internal flow passage 92 from the second liquid supply device 45. The second liquid LT, supplied from the second liquid supply device 45, flows through the internal flow passage 92. The first liquid LQ recovered from the second recovery port 91 also flows through the internal flow passage 92. The first liquid LQ and the second liquid LT flowed through the internal flow passage 92 are recovered by the second liquid recovery device 47. The second liquid recovery device 47 adjusts the pressure of the internal flow passage 92 so that the gas is not recovered from the second recovery port 91.

Although not shown, a gap is formed between the reference plate 73 held by the third holding portion 74 and a part of the measuring table 72 arranged around the reference plate 73. A second recovery port, in which a porous member is arranged, is arranged under or below the gap. The second recovery port is connected to the internal flow passage, which is adjusted so that the gas is not recovered.

Similarly, a gap is formed between the upper plate 79 held by the fifth holding portion 80 and a part of the measuring table 72 arranged around the upper plate 79. A second recovery port, in which a porous member is arranged, is arranged under or below the gap. The second recovery port is connected to the internal flow passage, which is adjusted so that the gas is not recovered.

As explained above, according to this embodiment, even when the first liquid LQ inflows from the gap (G2) formed around the member forming the part of the surface of the measuring table 72, it is possible to suppress the harmful influence caused by the vaporization of the first liquid LQ, in the same manner as in the first embodiment. That is, it is possible to suppress the temperature change (thermal deformation) of the slit plate 76, etc. which would be otherwise caused by the vaporization of the first liquid LQ. Therefore, it is possible to accurately execute the measurement process by using the respective measuring members.

In the case of the exposure apparatus of the second embodiment, the internal flow passage and the liquid recovery port as used in the first embodiment are provided on the substrate table 17. However, it is also allowable that these components are not provided on the substrate table 17. That is, it is allowable that only the measuring table 72 is provided with the liquid recovery port and the internal flow passage.

In the first and second embodiments described above, the pressure of the internal flow passage is adjusted by using the second liquid recovery device 47. However, the present invention is not limited to this. The pressure of the internal flow passage 41 may be adjusted by using a suction pump which is used widely for various purposes. Alternatively, the pressure of the internal flow passage 41 may be adjusted by controlling the flow rate of the second liquid supply device 45.

In the first and second embodiments described above, the second liquid LT, which flows through the internal flow passage (41, 92), may be made to flow from the first liquid supply device 24. That is, the first liquid LQ, which is the exposure liquid, may be used as the second liquid LT. In this way, it is easy to perform the control for providing the same temperature for the first liquid LQ and the second liquid LT. Further, it is possible to omit the second liquid supply device 45, and thus it is possible to simplify the structure of the exposure apparatus.

In the first and second embodiments described above, the optical path on the light-exit side (image plane side) of the final optical element 10, is filled with the first liquid LQ in relation to the projection optical system PL. However, as disclosed in International Publication No. 2004/019128, it is also possible to adopt a projection optical system in which the optical path on the light-incident side (object plane side) of the final optical element 10 is also filled with the first liquid LQ.

In the first and second embodiments, the porous member 51, 93 is used to adjust the pressure difference between the two spaces which interpose the porous member 51, 93. However, it is not necessarily indispensable to provide the porous member 51, 93. Even when the porous member is not provided, it is possible to recover the first liquid from the recovery port. Even when the porous member 51, 93 is arranged, the first liquid, inflowing from the gap, may be recovered together with the gas. It is not necessarily indispensable to provide the second liquid supply device 45 and the second liquid recovery device 47 for the exposure apparatus. The second liquid supply device 45 and the second liquid recovery device 47 may be provided at a place at which the exposure apparatus is installed, or any apparatus or device, which is present at such a place, may be utilized as the second liquid supply device 45 and the second liquid recovery device 47.

The first liquid LQ is water in the respective embodiments described above. However, the first liquid LQ may be any liquid other than water. It is preferable to use, as the first liquid LQ, liquids which have the transmittance with respect to the exposure light EL, which have the refractive index as high as possible, and which are stable against the film of the photosensitive material (photoresist) forming the surface of the substrate or the projection optical system. For example, it is also possible to use, as the first liquid LQ, hydrofluoroether (HFE), perfluoropolyether (PFPE), Fomblin oil, and cedar oil, etc. As for the liquid LQ, it is also allowable to use liquids having the refractive index of about 1.6 to 1.8. The optical element (the final optical element, etc.), of the projection optical system PL, which makes contact with the liquid LQ may be formed of a material having a refractive index (for example, not less than 1.6) higher than those of silica glass and calcium fluoride. As for the liquid LQ, it is also possible to use various fluids, for example, supercritical fluids. Further, when the exposure light EL is, for example, the $F_2$ laser beam, the $F_2$ laser beam is not transmitted through water. Therefore, liquids usable as the liquid LQ may include, for example, fluorine-based fluids such as fluorine-based oil and perfluoropolyether (PFPE) through which the $F_2$ laser beam is transmissive. In this case, the portion, which makes contact with the liquid LQ, is subjected to the liquid-attracting treatment by forming a thin film with a substance including fluorine having a molecular structure in which the polarity is small. When the liquid as described above is used as the first liquid LQ, the liquid of the same type as that of the first liquid LQ can be used for the second liquid LT as well.

In the respective embodiments described above, the first liquid LQ and the second liquid LT may be different liquids. Even when the first liquid LQ and the second liquid LT are the liquids of the different types, it is possible to suppress the temperature change caused by the heat of vaporization, owing to the fact that the liquids can smoothly flow through the internal flow passage 41 and that the liquids can be smoothly recovered by the second liquid recovery device.

The substrate P usable in the respective embodiments described above is not limited only to the semiconductor wafer for producing the semiconductor device. Those applicable include, for example, a glass substrate for a display device, a ceramic wafer for a thin film magnetic head, a master plate (synthetic silica glass, silicon wafer) for the mask or the reticle to be used for the exposure apparatus, etc.

As for the exposure apparatus EX, in addition to the scanning type exposure apparatus (scanning stepper) of the step-and-scan system for performing the scanning exposure with the pattern of the mask M by synchronously moving the mask M and the substrate P, the present invention is also applicable to a projection exposure apparatus (stepper) of the step-and-repeat system for performing the full field exposure with the pattern of the mask M in a state that the mask M and the substrate P are allowed to stand still, while successively stepmoving the substrate P.

It is also allowable that in exposure of the step-and-repeat system, a reduction image of a first pattern is transferred onto the substrate P by using the projection optical system in a state that the first pattern and the substrate P are allowed to substantially stand still, and then the full field exposure is performed on the substrate P by partially overlaying a reduction image of a second pattern with respect to the first pattern by using the projection optical system in a state that the second pattern and the substrate P are allowed to substantially stand still (full field exposure apparatus of the stitch system). As for the exposure apparatus of the stitch system, the present invention is also applicable to an exposure apparatus of the step-and-stitch system in which at least two patterns are partially overlaid and transferred on the substrate P, and the substrate P is successively moved.

The present invention is also applicable, for example, to an exposure apparatus in which patterns of two masks are combined on the substrate via the projection optical system, and one shot area on the substrate is subjected to the double exposure substantially simultaneously by one time of the scanning exposure as disclosed, for example, in U.S. Pat. No. 6,611,316. The present invention is also applicable, for example, to an exposure apparatus of the proximity system and a mirror projection aligner.

The present invention is also applicable to a twin-stage type exposure apparatus provided with a plurality of substrate stages as disclosed, for example, in U.S. Pat. Nos. 6,341,007, 6,208,407, and 6,262,796. The present invention is also applicable to an exposure apparatus provided with a plurality of substrate stages and a plurality of measuring stages.

As for the type of the exposure apparatus EX, the present invention is not limited to the exposure apparatus for the semiconductor device production for exposing the substrate P with the semiconductor device pattern. The present invention is also widely applicable, for example, to an exposure apparatus for producing a liquid crystal display device or for producing a display as well as an exposure apparatus for producing a thin film magnetic head, an image pickup device (CCD), a micromachine, MEMS, a DNA chip, a reticle, or a mask, etc.

In the respective embodiments described above, the interferometer system 7, which includes the laser interferometers 7A, 7B, is used to measure the position information about each of the mask stage 1 and the substrate stage 2. However, there is no limitation to this. For example, it is also allowable to use an encoder system detecting the scale (diffraction grating) provided on each of the stages 1, 2. In this case, it is preferable that a hybrid system including both of the interferometer system and the encoder system is provided.

In the respective embodiments described above, the ArF excimer laser may be used as the light source device for generating the ArF excimer laser light beam as the exposure light EL. However, it is also allowable to use a high harmonic wave-generating device which includes, for example, a solid laser light source such as a DFB semiconductor laser or a fiber laser; a light-amplifying section having a fiber amplifier or the like; and a wavelength-converting section, and which outputs a pulse light beam having a wavelength of 193 nm as disclosed, for example, in U.S. Pat. No. 7,023,610. Further, in the embodiments described above, each of the illumination and projection areas described above is rectangular. However, it is also allowable to adopt any other shape including circular arc-shaped forms, etc. In the exposure apparatus described above, the light source device for generating the exposure light and the illumination system may be optional parts which are distinct from the exposure apparatus.

In the respective embodiments described above, the light-transmissive type mask is used, in which a predetermined light-shielding pattern (or phase pattern or dimming or light-reducing pattern) is formed on the light-transmissive substrate. However, instead of such a mask, as disclosed, for example, in U.S. Pat. No. 6,778,257, it is also allowable to use a variable shaped mask (also referred to as "electronic mask", "active mask", or "image generator") on which a transmissive pattern, a reflective pattern, or a light-emitting pattern is formed based on the electronic data of the pattern to be subjected to the exposure. The variable shaped mask includes, for example, DMD (Digital Micro-mirror Device) as a kind of the non-light emission type image display device (spatial light modulator). It is also allowable to provide a pattern-forming device including a self-light emission type image display device, instead of the variable shaped mask provided with the non-light emission type image display device. The self-light emission type image display device includes CRT (Cathode Ray Tube), an inorganic EL display, an organic EL display (OLED: Organic Light Emitting Diode), a LED display, a LD display, an electric field emission display (FED: Field Emission Display), a plasma display (PDP: Plasma Display Panel), etc.

The respective embodiments described above are illustrative of the exemplary case of the exposure apparatus provided with the projection optical system PL. However, the present invention is applicable to an exposure apparatus and an exposure method which use no projection optical system PL. Even in such a case that the projection optical system PL is not used, the exposure light is irradiated onto the substrate via an optical member such as a lens, and the liquid immersion space is formed in a predetermined space between such an optical member and the substrate.

The present invention is also applicable to an exposure apparatus (lithography system) in which the substrate P is exposed with a line-and-space pattern by forming interference fringes on the substrate P as disclosed, for example, in International Publication No. 2001/035168.

As appreciated from the above, the exposure apparatus EX according to the embodiment of the present invention is produced by assembling the various subsystems including the respective constitutive elements as defined in claims so that the predetermined mechanical accuracy, electric accuracy and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include the mechanical connection, the wiring connection of the electric circuits, the piping connection of the air pressure circuits in correlation with the various subsystems, and the like. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which the temperature, the cleanness and the like are managed.

Figure 10:
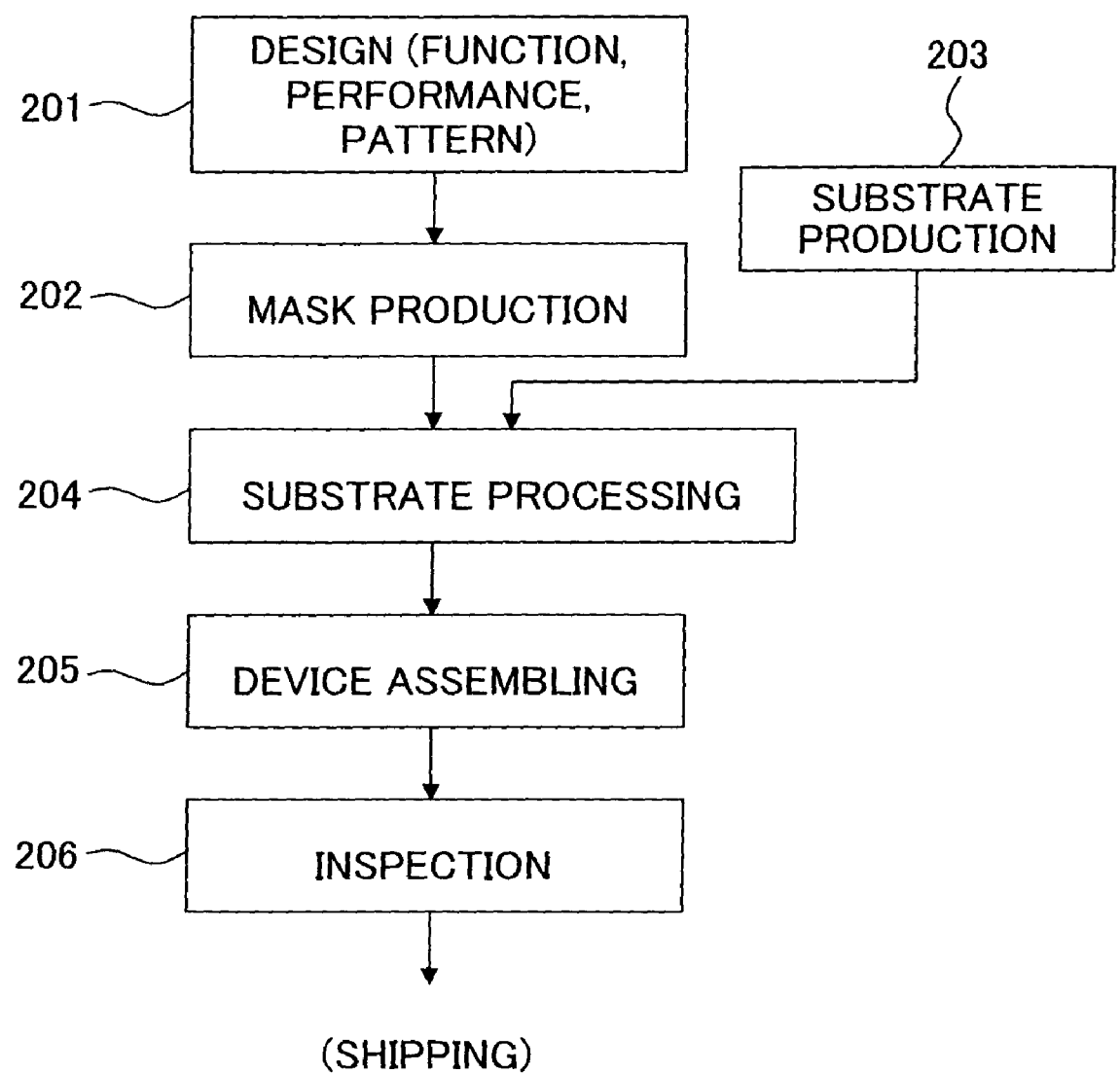
FIG. 10 is a flow chart illustrating an example of steps of producing a microdevice.

As shown in FIG. 10, a microdevice such as a semiconductor device is produced by performing a step 201 of designing the function and the performance of the microdevice; a step 202 of manufacturing a mask (reticle) based on the designing step; a step 203 of producing a substrate as a base material for the device; a substrate-processing step 204 including the substrate processing (exposure process) including the exposure of the substrate with the exposure light by using a pattern of the mask in accordance with the embodiment described above and the development of the exposed substrate; a step 205 of assembling the device (including processing processes such as a dicing step, a bonding step, and a packaging step); an inspection step 206; and the like. The development of the substrate, the device-assembling step including the processing processes such as the dicing, the bonding, and the packaging, and the inspection step are well-known in the field of the semiconductor production. Those skilled in the art can carry out the present invention even when any detailed explanation about the steps as described above is not described in this specification. Therefore, any description about the steps as described above is omitted from this specification.

The requirements of the respective embodiments described above can be appropriately combined with each other. A part or parts of the constitutive elements is/are not used in some cases. The contents of all of the published patent documents and United States patents, which relate to the exposure apparatus, etc. as referred to in the respective embodiments and the modified embodiments described above, are incorporated herein by reference within a range of permission of the domestic laws and ordinances.

The stage apparatus described above is capable of suppressing the influence of the heat of vaporization of the liquid, and makes it possible to accurately perform the operations including the various measurements, the exposure, etc. Therefore, the exposure apparatus, which is using the stage apparatus described above, makes it possible to produce the high function device at a high throughput. Therefore, the present invention will remarkably contribute to the international development of the precision mechanical equipment industry including the semiconductor industry.

What is claimed is:

1. A stage apparatus comprising:
a table member which holds a first object;
a liquid recovery port which is provided on the table member and via which a first liquid is recovered;
a first flow passage which is formed in the table member, which is connected to the liquid recovery port, and through which a second liquid flows to adjust a temperature of the table member; and
a pressure-adjusting device which adjusts a pressure of the first flow passage.

2. The stage apparatus according to claim 1, wherein the pressure-adjusting device adjusts the pressure so that a gas is not recovered from the liquid recovery port.

3. The stage apparatus according to claim 1, wherein the first liquid and the second liquid are of same type.

4. The stage apparatus according to claim 1, further comprising a porous member which is arranged in the liquid recovery port.

5. The stage apparatus according to claim 4, wherein the porous member has a first surface which faces the first flow passage, a second surface, and a plurality of pores which make communication between the first surface and the second surface; and
the pressure-adjusting device adjusts a difference between a pressure applied to the first surface and a pressure applied to the second surface.

6. The stage apparatus according to claim 4, wherein the first flow passage is filled with the second liquid.

7. The stage apparatus according to claim 4, wherein the pressure-adjusting device executes adjustment of the pressure so that only the first liquid is recovered via the porous member, depending on the first liquid and the porous member.

8. The stage apparatus according to claim 1, wherein the liquid recovery port recovers the first liquid from a gap provided around the first object held by the table member.

9. The stage apparatus according to claim 1, further comprising:
a liquid supply device which supplies the second liquid to the first flow passage; and
a liquid recovery device which is connected to the first flow passage and which recovers the liquid in the first flow passage.

10. The stage apparatus according to claim 9, wherein the liquid recovery device includes the pressure-adjusting device.

11. The stage apparatus according to claim 10, wherein the pressure-adjusting device includes: a tank which has an internal space in which a liquid space and a gas space are defined; and a regulator which is connected to the gas space and which adjusts a pressure in the gas space; and
the first flow passage is connected to the liquid space.

12. The stage apparatus according to claim 10, wherein the pressure-adjusting device includes: a tank which has an internal space; a comparting member which is arranged in the internal space in a vertical direction and which divides a part of the internal space into a first space and a second space; and a regulator which is connected to a gas space in the tank and which adjusts a pressure in the gas space;
the first flow passage is connected to the first space; and
the liquid from the first flow passage overflows from the first space and flows into the second space.

13. The stage apparatus according to claim 1, wherein the table member has a first holding portion which holds the first object, the first holding portion including: a support portion which supports a lower surface of the first object; a rim portion which is arranged around the support portion and which has an annular upper surface opposite to the lower surface of the first object; and a sucking port which is arranged inside the rim portion and which sucks a gas; and
the liquid recovery port is arranged around the rim portion.

14. The stage apparatus according to claim 13, wherein the table member has a first portion which is arranged around the first object held by the first holding portion; and
a gap is formed between the first portion and the first object held by the first holding portion.

15. The stage apparatus according to claim 13, wherein the table member has a second holding portion which holds a second object around the first object held by the first holding portion; and
a gap is formed between the first object and the second object.

16. The stage apparatus according to claim 15, wherein the liquid recovery port is arranged between the first holding portion and the second holding portion.

17. An exposure apparatus which exposes a substrate with an exposure light through a first liquid, the exposure apparatus comprising the stage apparatus as defined in claim 1.

18. The exposure apparatus according to claim 17, wherein the first object includes the substrate.

19. The exposure apparatus according to claim 17, wherein the first object includes a measuring member which is irradiated with the exposure light through the first liquid.

20. The exposure apparatus according to claim 17, further comprising:
an optical member via which the exposure light exits; and
a liquid immersion member which is capable of retaining the first liquid between the substrate and the liquid immersion member so that an optical path for the exposure light exiting from the optical member is filled with the first liquid.

21. A method for producing a device, comprising:
exposing a substrate by using the exposure apparatus as defined in claim 17;
developing the exposed substrate; and
processing the developed substrate.

22. An exposure apparatus which exposes a substrate through a first liquid, the exposure apparatus comprising:
an optical member via which an exposure light exits;
a table which holds an object or the substrate;
a recovery port which is provided on the table and via which the first liquid is recovered; and
a flow passage which is formed in the table and through which a second liquid flows to adjust a temperature of the table;
wherein the recovery port and the flow passage are in fluid-communication in the table.

23. The exposure apparatus according to claim 22, wherein the flow passage further includes a groove which is formed on the table to surround the object or the substrate, and the recovery port is formed along the groove.

24. The exposure apparatus according to claim 22, further comprising a recovery device which simultaneously recovers the first liquid and the second liquid via the flow passage, wherein the recovery device has a gas space and a liquid space.

25. The exposure apparatus according to claim 22, wherein a porous member is provided on the recovery port; a side of the flow passage of the porous member is filled with the second liquid; and the first liquid, which contains no bubble, flows into the flow passage via the porous member when a recovery device applies a negative pressure to the flow passage.

26. An exposure method for exposing a substrate with an exposure light through a first liquid, the exposure method comprising:
    holding the substrate on a table member;
    adjusting a temperature of the table member, by causing a second liquid to flow through a first flow passage provided in the table member and connected to a liquid recovery port which is provided on the table member and via which at least a part of the first liquid is recovered;
    filling an optical path for the exposure light with the first liquid, the optical path being between an optical member and the substrate; and
    adjusting a pressure of the first flow passage.

27. The exposure method according to claim 26, wherein the first liquid and the second liquid are discharged from the table member by applying a negative pressure to a liquid discharge port of the first flow passage.

28. The exposure method according to claim 27, wherein a porous member is provided on the liquid recovery port, and the negative pressure is applied to the liquid discharge port of the first flow passage so that only the liquid is caused to flow into the first flow passage via the porous member.

29. The exposure method according to claim 28, wherein a space on a side of the first flow passage of the porous member is filled with the second liquid.

30. A method for producing a device, comprising exposing a substrate by using the exposure method as defined in claim 26; developing the exposed substrate; and processing the developed substrate.

* * * * *